US007940859B2

(12) United States Patent
Hara et al.

(10) Patent No.: US 7,940,859 B2
(45) Date of Patent: May 10, 2011

(54) TRANSMISSION CIRCUIT AND COMMUNICATION DEVICE

(75) Inventors: Yoshihiro Hara, Osaka (JP); Katsuhiko Morioka, Kanagawa (JP); Kaoru Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 952 days.

(21) Appl. No.: 11/882,251

(22) Filed: Jul. 31, 2007

(65) Prior Publication Data

US 2008/0031384 A1    Feb. 7, 2008

(30) Foreign Application Priority Data

Aug. 4, 2006   (JP) .................................. 2006-213697

(51) Int. Cl.
*H03C 1/52*   (2006.01)
*H04L 27/04*   (2006.01)

(52) U.S. Cl. ......................................................... 375/300

(58) Field of Classification Search .................. 375/260, 375/261, 265, 295, 296, 297, 300, 302, 316, 375/344, 345; 455/91, 102, 108, 109, 110, 455/126, 127.3, 522
See application file for complete search history.

(56) References Cited

U.S. PATENT DOCUMENTS

| 6,701,138 | B2 | 3/2004 | Epperson et al. | |
| 6,998,919 | B2 | 2/2006 | Gamero et al. | |
| 7,023,292 | B2 * | 4/2006 | Pehlke et al. | 332/151 |
| 7,496,375 | B2 * | 2/2009 | Matsumoto | 455/522 |
| 2003/0160658 | A1 * | 8/2003 | Cioffi et al. | 330/297 |
| 2003/0210751 | A1 * | 11/2003 | Barak et al. | 375/295 |
| 2004/0036530 | A1 * | 2/2004 | Matsuura et al. | 330/10 |
| 2004/0219891 | A1 * | 11/2004 | Hadjichristos | 455/102 |
| 2005/0164660 | A1 * | 7/2005 | Matsuura et al. | 455/126 |
| 2005/0215209 | A1 * | 9/2005 | Tanabe et al. | 455/127.1 |
| 2005/0245214 | A1 * | 11/2005 | Nakamura et al. | 455/127.3 |
| 2006/0290408 | A1 * | 12/2006 | Okada | 327/513 |

* cited by examiner

*Primary Examiner* — David C. Payne
*Assistant Examiner* — Syed Haider
(74) *Attorney, Agent, or Firm* — Wenderoth, Lind & Ponack, L.L.P.

(57) ABSTRACT

A transmission circuit is capable of precisely compensating for an offset characteristic of an amplitude modulation section, and operating with low distortion and high efficiency over a wide output electric power range. A signal generation section outputs an amplitude signal and an angle modulation signal. An amplitude amplifying section inputs, to the amplitude modulation section, a signal corresponding to a magnitude of the amplitude signal having been inputted. The amplitude modulation section amplitude-modulates the angle modulation signal with the signal inputted from the amplitude amplifying section, and outputs a resultant signal as a modulation signal. The power measuring section measures an output power of the amplitude modulation section. An offset compensation section reads an offset compensation value from a memory in accordance with the output power of the amplitude modulation section, and adds the read offset compensation value to the amplitude signal.

9 Claims, 31 Drawing Sheets

FIG. 2

| OUTPUT POWER | OFFSET COMPENSATION VALUE |
|---|---|
| Vo1 | AMO1 |
| Vo2 | AMO2 |
| Vo3 | AMO3 |
| : | : |

13

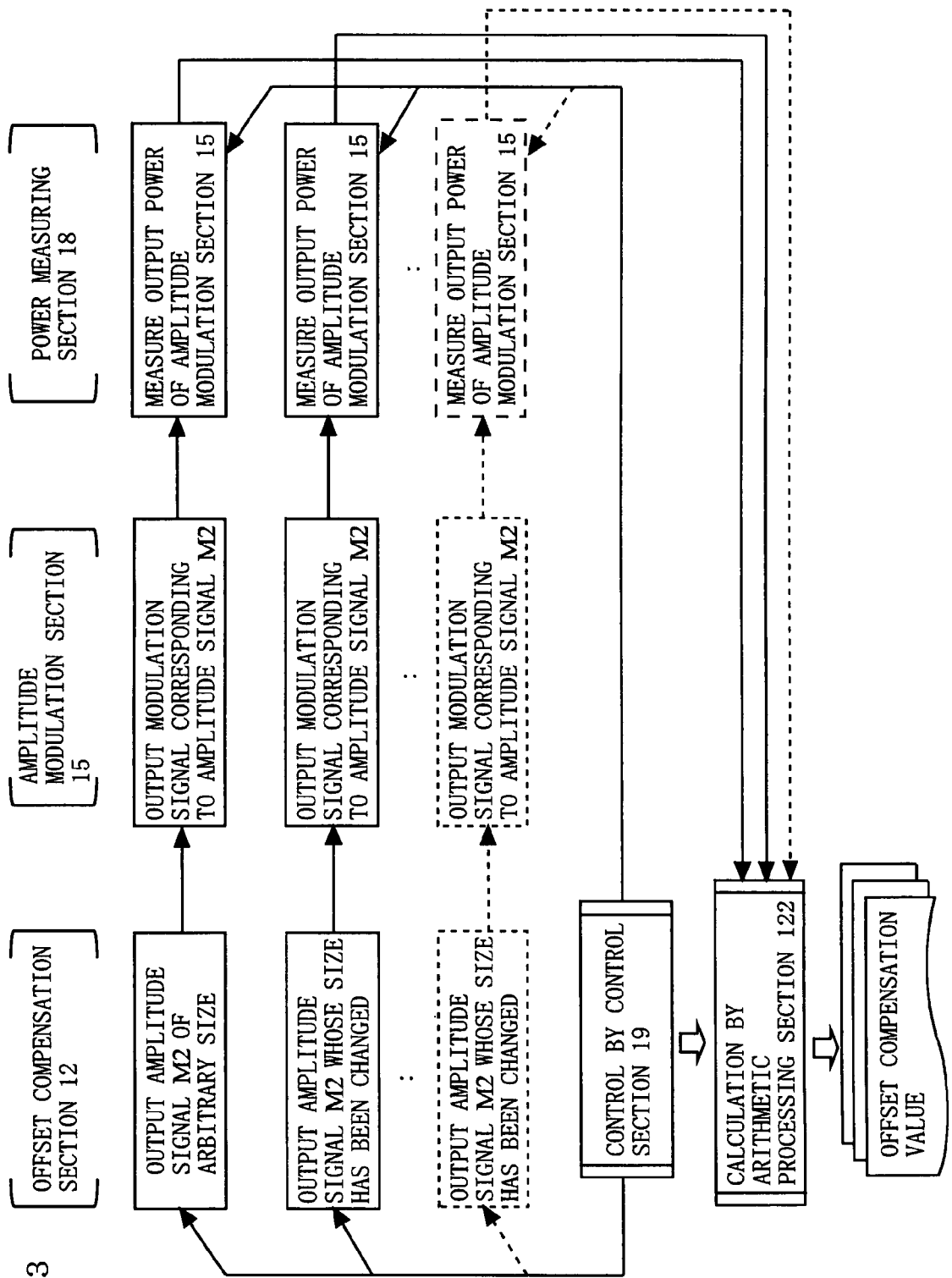

F I G. 7A
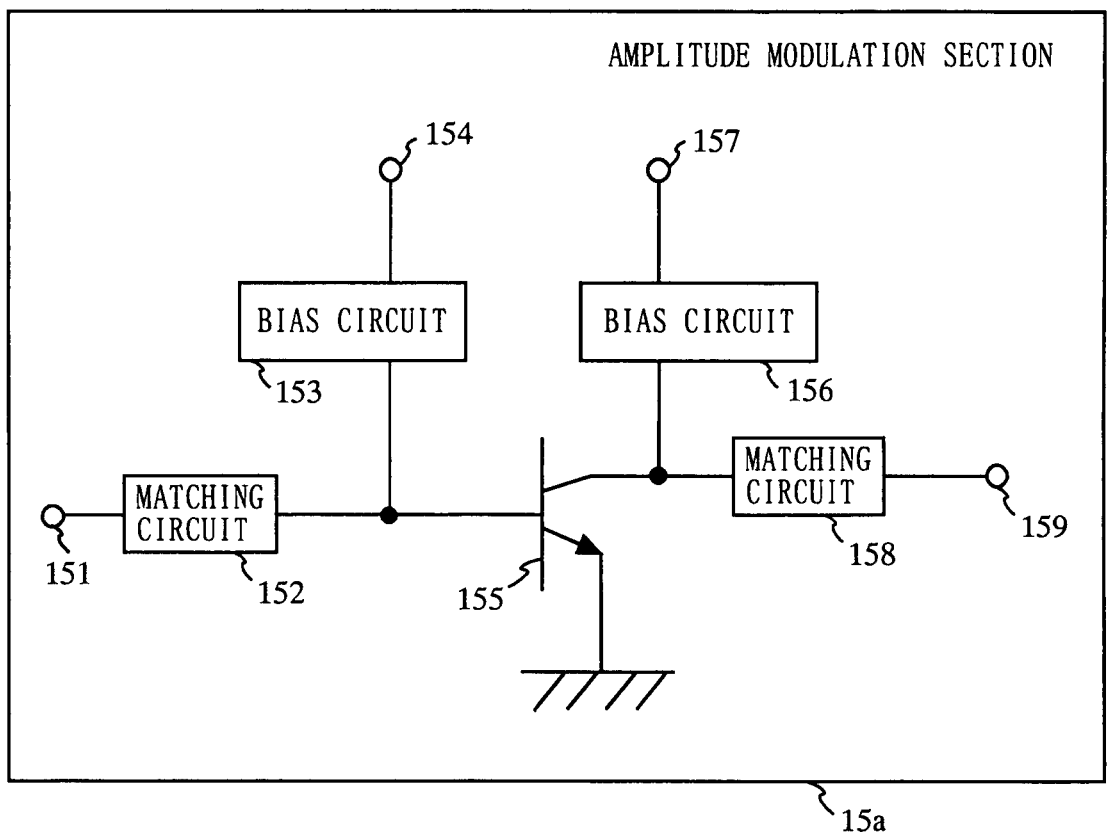

F I G. 9

23

| OUTPUT POWER | OFFSET COMPENSATION VALUE | GAIN |
|---|---|---|
| Vo1 | AMO1 | Gain1 |
| Vo2 | AMO2 | Gain2 |
| Vo3 | AMO3 | Gain3 |
| ⋮ | ⋮ | |

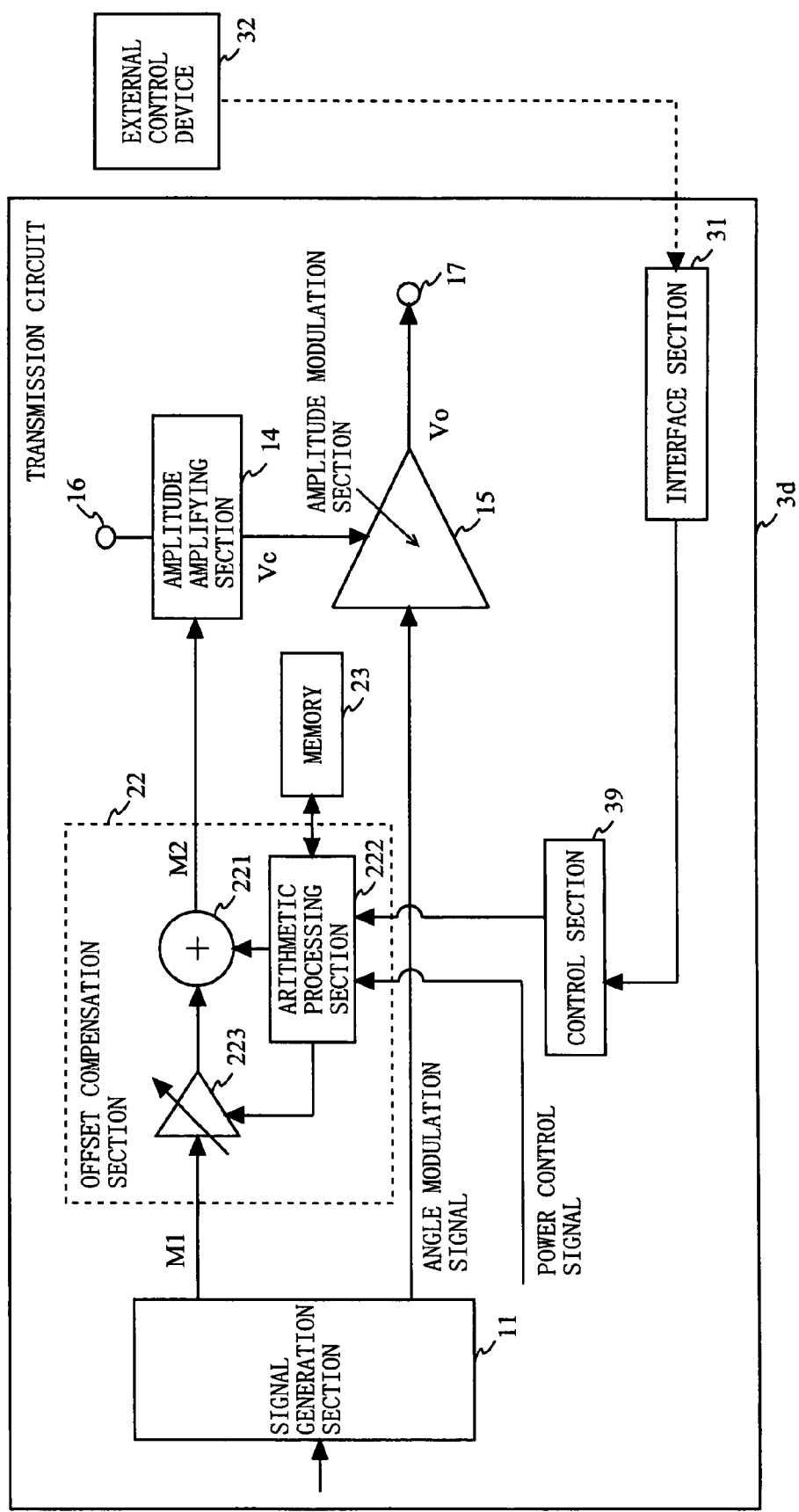

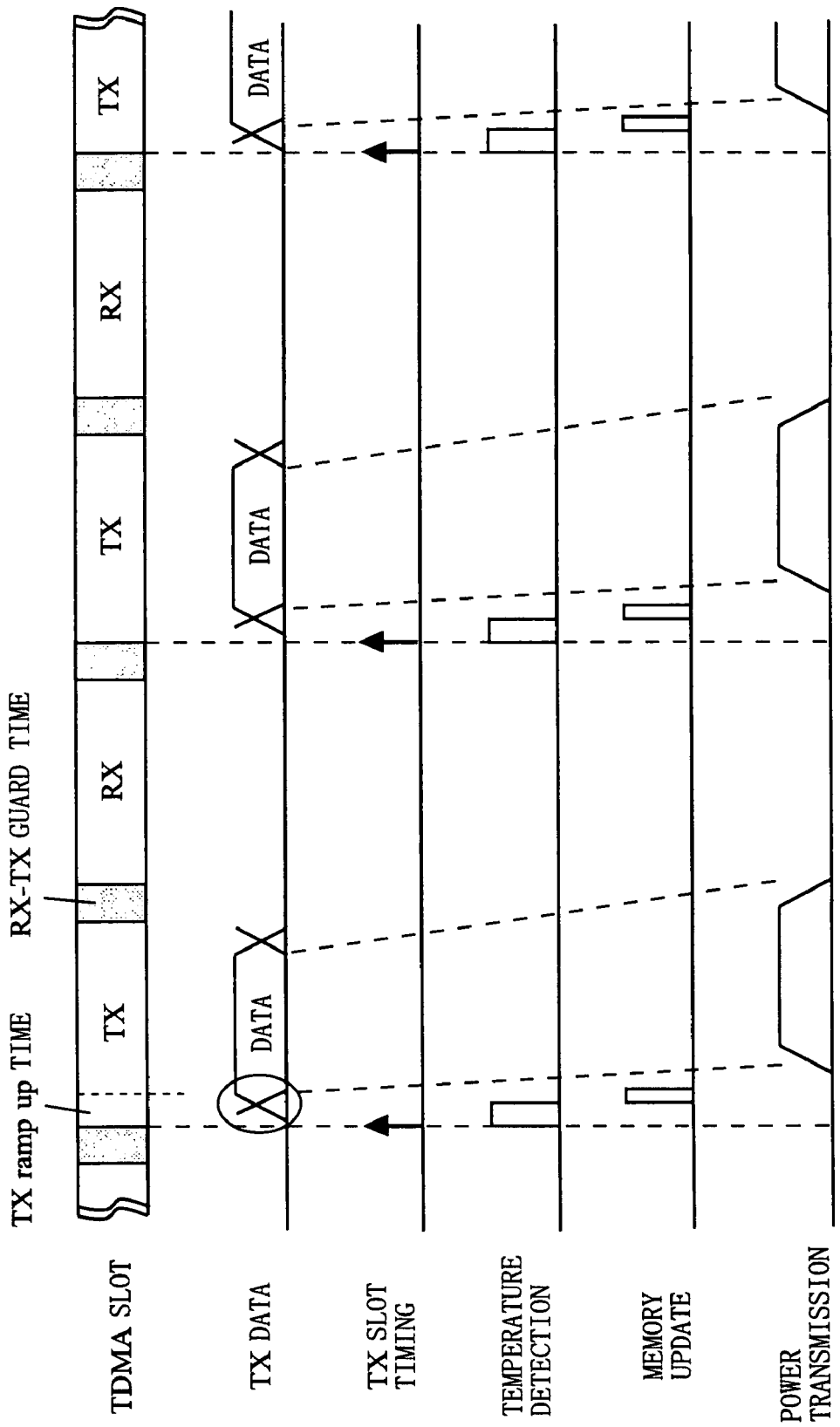

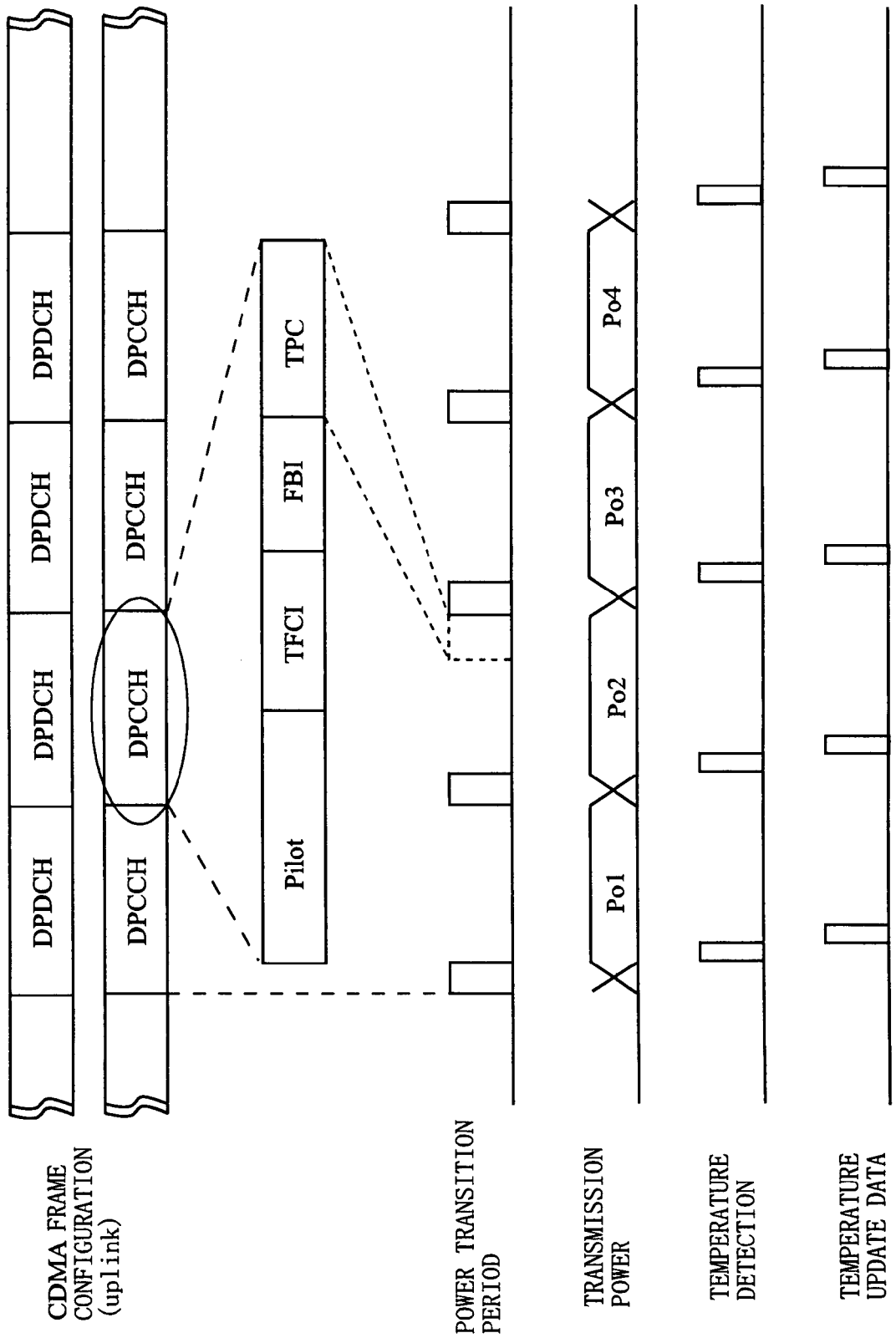

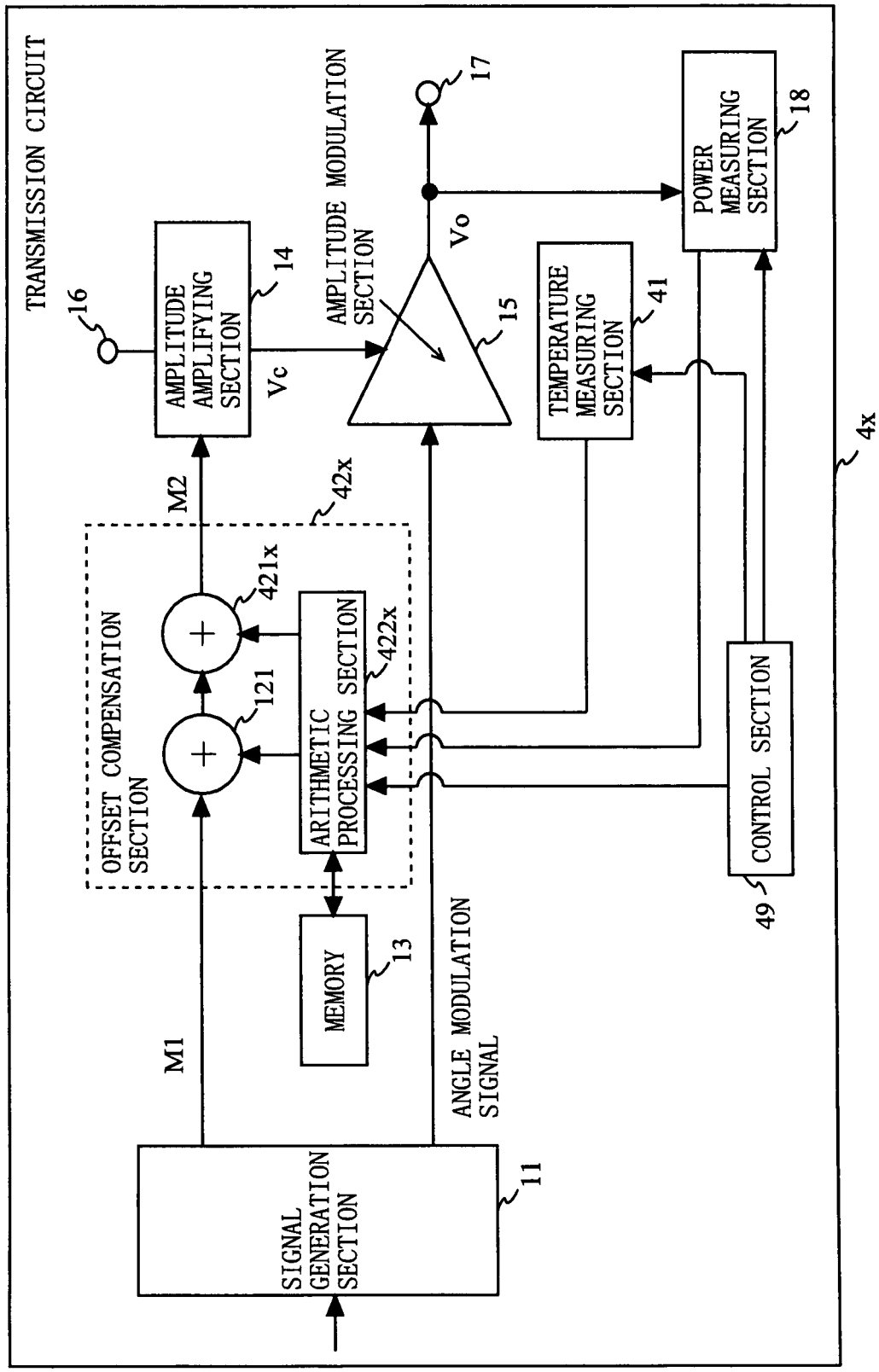
F I G. 1 4

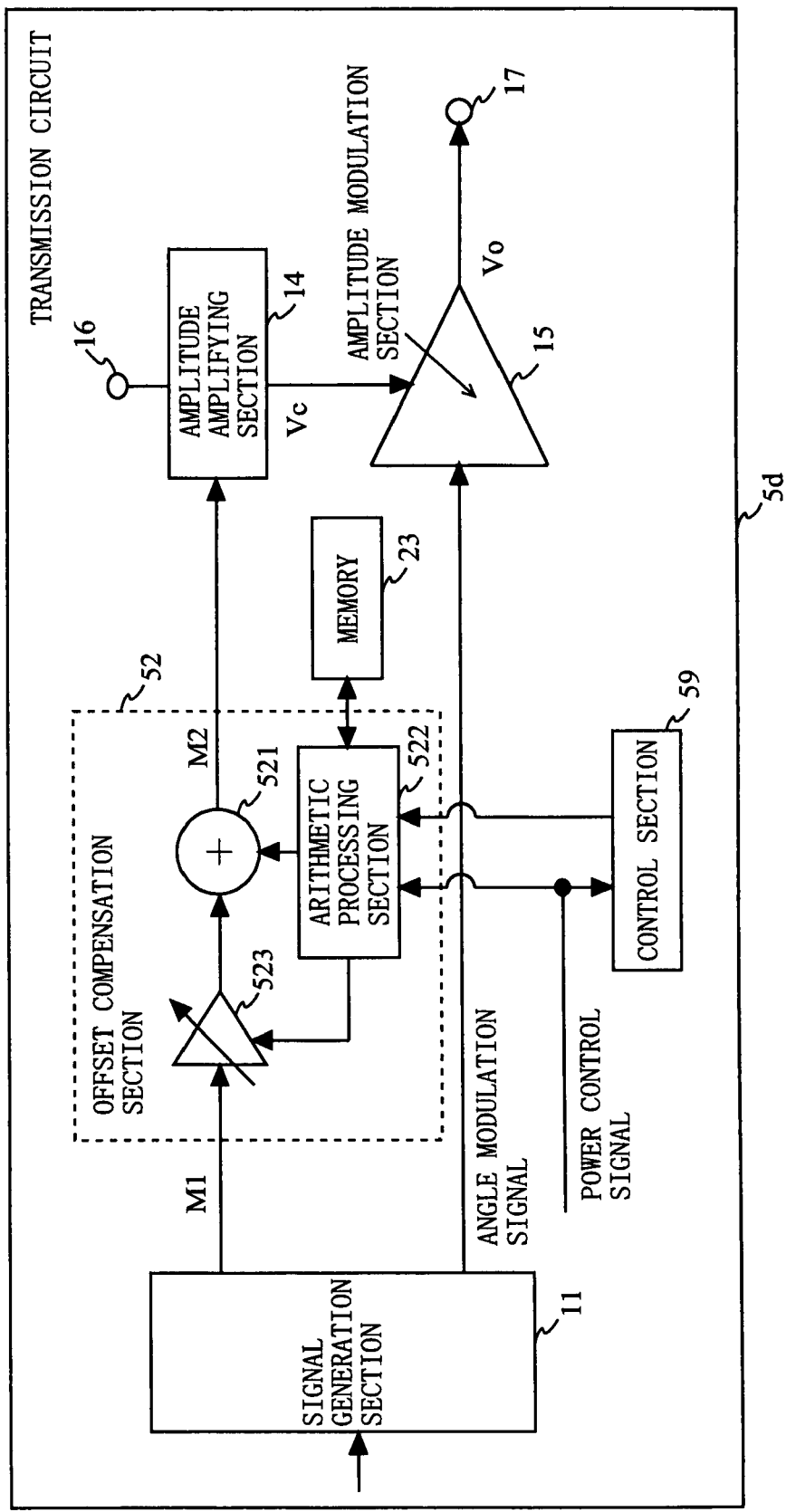
F I G. 15 D

TRANSMISSION CIRCUIT AND COMMUNICATION DEVICE

BACKGROUND OF THE INVENTION

1. Field of the Invention

The present invention relates to a transmission circuit used for communication devices such as mobile phones and wireless LAN devices, and particularly to a transmission circuit, which operates with low distortion and high efficiency, and a communication device using the transmission circuit.

2. Description of the Background Art

Communication devices such as mobile phones and wireless LAN devices are required to, even when operating over a wide bandwidth, secure precision of a transmission signal while operating with low power consumption. For such a communication device, a transmission circuit, which is capable of outputting a transmission signal with a high precision regardless of a bandwidth and operating with high efficiency, is used. Hereinafter, conventional transmission circuits will be described.

One of the conventional transmission circuits is, for example, a transmission circuit which uses a modulation method such as a quadrature modulation method to generate a transmission signal (hereinafter, referred to as a quadrature modulation circuit). Since the quadrature modulation circuit is well known, the description thereof will be omitted. A conventional transmission circuit, which is smaller in size and operates more efficiently than the quadrature modulation circuit, is, e.g., a transmission circuit 500 shown in FIG. 18. FIG. 18 is a block diagram showing an exemplary configuration of the conventional transmission circuit 500. In FIG. 18, the conventional transmission circuit 500 comprises a signal generation section 501, output terminal 502, amplitude amplifying section 503, amplitude modulation section 504 and a power supply terminal 505.

In the conventional transmission circuit 500, the signal generation section 501 outputs an amplitude signal and angle modulation signal. The amplitude signal is inputted to the amplitude amplifying section 503. The amplitude amplifying section 503 supplies, to the amplitude modulation section 504, a voltage corresponding to a magnitude of the inputted amplitude signal. To the amplitude amplifying section 503, a DC voltage is supplied from the power supply terminal 505. Typically, the amplitude amplifying section 503 supplies, to the amplitude modulation section 504, a voltage proportional to the magnitude of the inputted amplitude signal.

The angle modulation signal outputted from the signal generation section 501 is inputted to the amplitude modulation section 504. The amplitude modulation section 504 amplitude-modulates the angle modulation signal by using the voltage supplied from the amplitude amplifying section 503 (in this example, a collector voltage Vc), and outputs a resultant signal as a modulation signal having been angle-modulated and amplitude-modulated. This modulation signal is outputted from the output terminal 502 as a transmission signal. The transmission circuit 500 which operates in the above manner is called a polar modulation circuit.

The conventional transmission circuit 500 cannot always output a transmission signal with a high precision, depending on a characteristic of the amplitude modulation section 504. Described below with reference to FIG. 19 is a characteristic of the amplitude modulation section 504. FIG. 19 shows a relationship between the collector voltage Vc supplied to the amplitude modulation section 504 and an output voltage Vo. Here, a magnitude of an input voltage (angle modulation signal) is fixed. As shown in FIG. 19, when an HBT (Heterojunction Bipolar Transistor) is used as the amplitude modulation section 504, the amplitude modulation section 504 is unable to output a voltage unless the collector voltage Vc is a particular threshold value or greater, i.e., the amplitude modulation section 504 is unable to output the output voltage Vo linearly to the inputted collector voltage Vc. Hereinafter, this characteristic of the amplitude modulation section 504 is referred to as an offset characteristic As shown in FIG. 19, the offset characteristic changes in accordance with, e.g., a temperature of the amplitude modulation section 504 and an individual difference of the amplitude modulation section 504. Such a change is mainly caused by a characteristic of the HBT used for the amplitude modulation section 504. For example, the offset characteristic of the amplitude modulation section 504 changes when the temperature of the amplitude modulation section 504 changes from a low temperature to a room temperature, or from a room temperature to a high temperature. It is assumed in the example of FIG. 19 that the temperature of the amplitude modulation section 504 ranges from −25° C. to 120° C., and the room temperature is approximately 25° C. FIG. 19 shows an example in which a gradient of a line indicating the relationship between the collector voltage Vc and the output voltage Vo is fixed. However, there is a case where the gradient of the line changes in accordance with the temperature of the amplitude modulation section 504.

U.S. Pat. No. 6,998,919 (hereinafter, referred to as Patent Document 1) discloses a transmission circuit 600, which compensates for the offset characteristic of the amplitude modulation section 504 in accordance with the temperature of the amplitude modulation section 504. FIG. 20 is a block diagram showing an exemplary configuration of the conventional transmission circuit 600 disclosed in Patent Document 1. As shown in FIG. 20, the conventional transmission circuit 600 comprises the signal generation section 501, the output terminal 502, the amplitude amplifying section 503, the amplitude modulation section 504, the power supply terminal 505, a temperature sensor 601 and an offset compensation section 602. The temperature sensor 601 measures the temperature of the amplitude modulation section 504. The offset compensation section 602 changes, in accordance with the temperature of the amplitude modulation section 504 which has been measured by the temperature sensor 601, a magnitude of an inputted amplitude signal, thereby compensating for the offset characteristic of the amplitude modulation section 504.

However, there is a possibility that in the conventional transmission circuit 600 (see FIG. 20), the offset characteristic in relation to the temperature of the amplitude modulation section 504 is not always fixed because of, e.g., an individual difference or the like of the amplitude modulation section 504, and this causes inconsistency of an output signal from the amplitude modulation section 504. Thus, the conventional transmission circuit 600 has a problem that the offset characteristic of the amplitude modulation section 504 is not precisely compensated for, whereby distortion occurs in a transmission signal.

SUMMARY OF THE INVENTION

Therefore, an object of the present invention is to provide a transmission circuit, which is capable of precisely compensating for the offset characteristic of the amplitude modulation section and operating with low distortion and high efficiency over a wide output electric power range, and to provide a communication device using the transmission circuit.

The object of the present invention is directed to a transmission circuit for generating and outputting a transmission signal based on input data. In order to achieve the aforementioned object, the transmission circuit comprises: a signal generating section for performing predetermined signal processing on the input data, thereby generating an amplitude signal and an angle modulation signal; an offset compensation section for compensating for a magnitude of the amplitude signal in accordance with a predetermined instruction; an amplitude amplifying section for outputting a signal corresponding to the magnitude of the amplitude signal inputted via the offset compensation section; an amplitude modulation section for amplitude-modulating the angle modulation signal by using the signal outputted from the amplitude amplifying section, and outputting a resultant signal as a modulation signal having been angle-modulated and amplitude-modulated; a power measuring section for measuring an output power of the amplitude modulation section; a memory section for storing an offset compensation value for compensating for an offset characteristic of the amplitude modulation section; and a control section for controlling, at a predetermined timing, operations of the offset compensation section and the power measuring section. In accordance with an instruction from the control section, the offset compensation section reads, from the memory section, the offset compensation value corresponding to the output power of the amplitude modulation section, which output power has been measured by the power measuring section, and adds the read offset compensation value to the amplitude signal.

Preferably, the offset compensation section includes: an arithmetic processing section for reading, from the memory section, the offset compensation value corresponding to the output power of the amplitude modulation section; and an adder section for adding, to the amplitude signal, the offset compensation value read by the arithmetic processing section.

The memory section may further store a gain for compensating for an offset characteristic gradient of the amplitude modulation section. In such a case, the offset compensation section includes: an arithmetic processing section for reading, from the memory section, the offset compensation value and a gain which correspond to the output power of the amplitude modulation section; a variable gain amplifier section for amplifying the amplitude signal by the gain read by the arithmetic processing section; and an adder section for adding the offset compensation value read by the arithmetic processing section to the amplitude signal outputted from the variable gain amplifier section.

Preferably, the control section instructs the arithmetic processing section and the power measuring section to calculate the offset compensation value for compensating for the offset characteristic of the amplitude modulation section. In such a case, when instructed to calculate the offset compensation value, the power measuring section measures the output power of the amplitude modulation section. When instructed to calculate the offset compensation value, the arithmetic processing section outputs a plurality of amplitude signals whose magnitudes are varied from each other, and calculates the offset compensation value in accordance with a change in the output power of the amplitude modulation section, the change occurring when the plurality of amplitude signals are outputted.

Further, the control section is capable of instructing the arithmetic processing section and the power measuring section to calculate the gain for compensating for the offset characteristic gradient of the amplitude modulation section. In such a case, when instructed to calculate the gain, the power measuring section measures the output power of the amplitude modulation section. When instructed to calculate the gain, the arithmetic processing section outputs a plurality of amplitude signals whose magnitudes are varied from each other, and calculates the gain for compensating for the offset characteristic gradient in accordance with a change in the output power of the amplitude modulation section, the change occurring when the plurality of amplitude signals are outputted.

Preferably, the transmission circuit further comprises a temperature measuring section for measuring a temperature of the amplitude modulation section. The control section provides the arithmetic processing section and the temperature measuring section with an instruction to update a stored content of the memory section. In this case, in accordance with the instruction from the control section, the temperature measuring section measures the temperature of the amplitude modulation section. In accordance with the instruction from the control section, the arithmetic processing section calculates the offset compensation value corresponding to the temperature of the amplitude modulation section which has been measured by the temperature measuring section, and updates the stored content of the memory section by using the calculated offset compensation value.

The transmission circuit further comprises a temperature measuring section for measuring a temperature of the amplitude modulation section. The control section provides the arithmetic processing section and the temperature measuring section with an instruction to update a stored content of the memory section. In this case, in accordance with the instruction from the control section, the temperature measuring section measures the temperature of the amplitude modulation section. In accordance with the instruction from the control section, the arithmetic processing section calculates the gain for compensating for the offset characteristic gradient corresponding to the temperature of the amplitude modulation section, which temperature has been measured by the temperature measuring section, and updates the stored content of the memory section by using the calculated gain.

The transmission circuit of the present invention may have a configuration comprising: a signal generating section for performing predetermined signal processing on the input data, thereby generating an amplitude signal and an angle modulation signal; an offset compensation section for compensating for a magnitude of the amplitude signal; an amplitude amplifying section for outputting a signal corresponding to the magnitude of the amplitude signal inputted via the offset compensation section; an amplitude modulation section for amplitude-modulating the angle modulation signal by using the signal outputted from the amplitude amplifying section, and outputting a resultant signal as a modulation signal having been angle-modulated and amplitude-modulated; a memory section for storing an offset compensation value for compensating for an offset characteristic of the amplitude modulation section; and a control section for controlling an operation of the offset compensation section at a predetermined timing. Here, a power control signal for controlling an output power of the transmission signal is inputted to the offset compensation section. In accordance with an instruction from the control section, the offset compensation section reads, from the memory section, the offset compensation value corresponding to the power control signal, and adds the read offset compensation value to the amplitude signal.

The present invention is also directed to a communication device comprising the above-described transmission circuit. The communication device also comprises: a transmission circuit for generating a transmission signal; and an antenna for outputting the transmission signal generated by the transmission circuit. The communication device may further comprise: a reception circuit for processing a reception signal received from the antenna; and an antenna duplexer for outputting the transmission signal generated by the transmission circuit to the antenna, and outputting the reception signal received from the antenna to the reception circuit.

As described above, according to the present invention, the offset compensation section adds the offset compensation value of the amplitude modulation section to the amplitude signal in accordance with the output power of the amplitude modulation section. Consequently, even if there is inconsistency of an output signal of the amplitude modulation section due to an individual difference or the like of the amplitude modulation section, the offset compensation section is able to precisely compensate for the offset characteristic of the amplitude modulation section. This allows the transmission circuit to operate with low distortion and high efficiency over a wide output electric power range.

Further, according to the present invention, the offset compensation section amplifies, based on the output power of the amplitude modulation section, the amplitude signal so as to compensate for the offset characteristic gradient of the amplitude modulation section. As a result, even if there is inconsistency of the output signal of the amplitude modulation section due to an individual difference or the like of the amplitude modulation section, the offset compensation section is able to precisely compensate for the offset characteristic of the amplitude modulation section. This allows the transmission circuit to operate with low distortion and high efficiency over a wide output electric power range.

By using the above-described transmission circuit, the communication device of the present invention is able to operate with low distortion and high efficiency over a wide output electric power range.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows an example of stored contents of a memory 13;

FIG. 3 shows a flow of an exemplary method of calculating an offset compensation value;

FIG. 6A is a block diagram showing an exemplary configuration of a series regulator 14a;

FIG. 7A is a block diagram showing an exemplary configuration of an amplitude modulation section 15a;

FIG. 9 shows an example of stored contents of a memory 23;

FIG. 10D is a block diagram showing an exemplary configuration of a transmission circuit 3d according to the third embodiment of the present invention;

FIG. 12 illustrates a timing of updating the offset compensation value in the case where the transmission circuit 4 is applied to a TDMA system;

FIG. 13 illustrates a timing of updating the offset compensation value in the case where the transmission circuit 4 is applied to a CDMA system;

FIG. 14 is a block diagram showing an exemplary configuration of a transmission circuit 4x according to the fourth embodiment of the present invention;

FIG. 15D is a block diagram showing an exemplary configuration of a transmission circuit 5d according to the fifth embodiment of the present invention;

DESCRIPTION OF THE PREFERRED EMBODIMENTS

First Embodiment

Figure 1A:
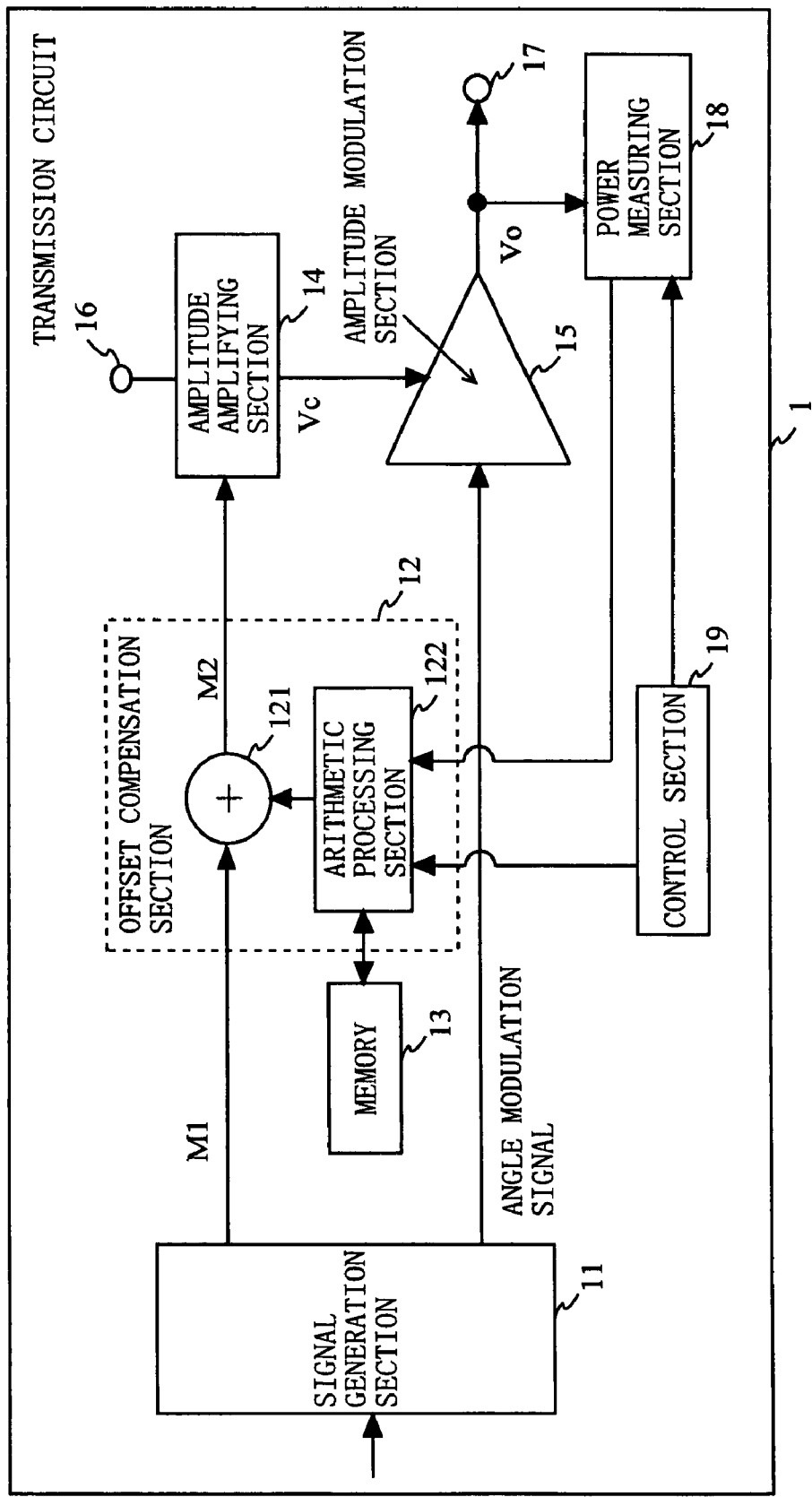
FIG. 1A is a block diagram showing an exemplary configuration of a transmission circuit 1 according to a first embodiment of the present invention.

FIG. 1A is a block diagram showing an exemplary configuration of a transmission circuit 1 according to a first embodiment of the present invention. As shown in FIG. 1A, the transmission circuit 1 comprises a signal generation section 11, offset compensation section 12, memory 13, amplitude amplifying section 14, amplitude modulation section 15, power supply terminal 16, output terminal 17, power measuring section 18 and a control section 19. The offset compensation section 12 includes an adder 121 and an arithmetic processing section 122. Here, the offset compensation section 12 may include the memory 13.

The signal generation section 11 perform predetermined signal processing on input data, thereby generating an amplitude signal M1 and an angle modulation signal. The amplitude signal M1 is inputted to the offset compensation section 12. The offset compensation section 12 compensates for a magnitude of the amplitude signal M1, and then outputs a resultant signal as an amplitude signal M2. The amplitude signal M2 is inputted to the amplitude amplifying section 14. To the amplitude amplifying section 14, a DC voltage is supplied from the power supply terminal 16. The amplitude amplifying section 14 supplies, to the amplitude modulation section 15, a signal corresponding to a magnitude of the inputted amplitude signal M2. Typically, the amplitude amplifying section 14 supplies, to the amplitude modulation section 15, a voltage proportional to the magnitude of the amplitude signal M2. Here, the amplitude amplifying section 14 may supply, to the amplitude modulation section 15, an electric current proportional to the inputted amplitude signal M2. On the other hand, the angle modulation signal is inputted to the amplitude modulation section 15. The amplitude modulation section 15 phase-modulates the angle modulation signal by using the voltage supplied from the amplitude amplifying section 14, and outputs a resultant signal as a modulation signal having been angle-modulated and phase-modulated. This modulation signal is outputted from the output terminal 17 as a transmission signal.

The memory 13 stores an offset compensation value for compensating for an offset characteristic of the amplitude modulation section 15. FIG. 2 shows an example of contents stored in the memory 13. As shown in FIG. 2, the memory 13 stores offset compensation values (e.g., AMO1, AMO2 and AMO3) corresponding to output powers of the amplitude modulation section 15 (e.g., output voltages Vo1, Vo2 and Vo3 of the amplitude modulation section 15). The offset compensation values may be prestored in the memory 13, or may be calculated by a predetermined method. The method of calculating the offset compensation values will be described later in detail.

The control section 19 controls operations of the offset compensation section 12 and power measuring section 18. For example, the control section 19 instructs the offset compensation section 12 about a timing of compensating for the magnitude of the amplitude signal M1, and instructs the power measuring section 18 about a timing of measuring an output power of the amplitude modulation section 15. The power measuring section 18 measures the output power of the amplitude modulation section 15 in accordance with the instruction from the control section 19. It is assumed here that the power measuring section 18 measures, as the output power of the amplitude modulation section 15, the output voltage Vo (or an output electric power) of the amplitude modulation section 15. In the offset compensation section 12, the output power of the amplitude modulation section 15, which has been measured by the power measuring section 18, is inputted to the arithmetic processing section 122. The arithmetic processing section 122 reads, from the memory 13, an offset compensation value corresponding to the output power of the amplitude modulation section 15, and outputs the offset compensation value to the adder 121. The adder 121 adds the offset compensation value, which is outputted from the arithmetic processing section 122, to the amplitude signal M1, and outputs a resultant signal as the amplitude signal M2.

Figure 1B:
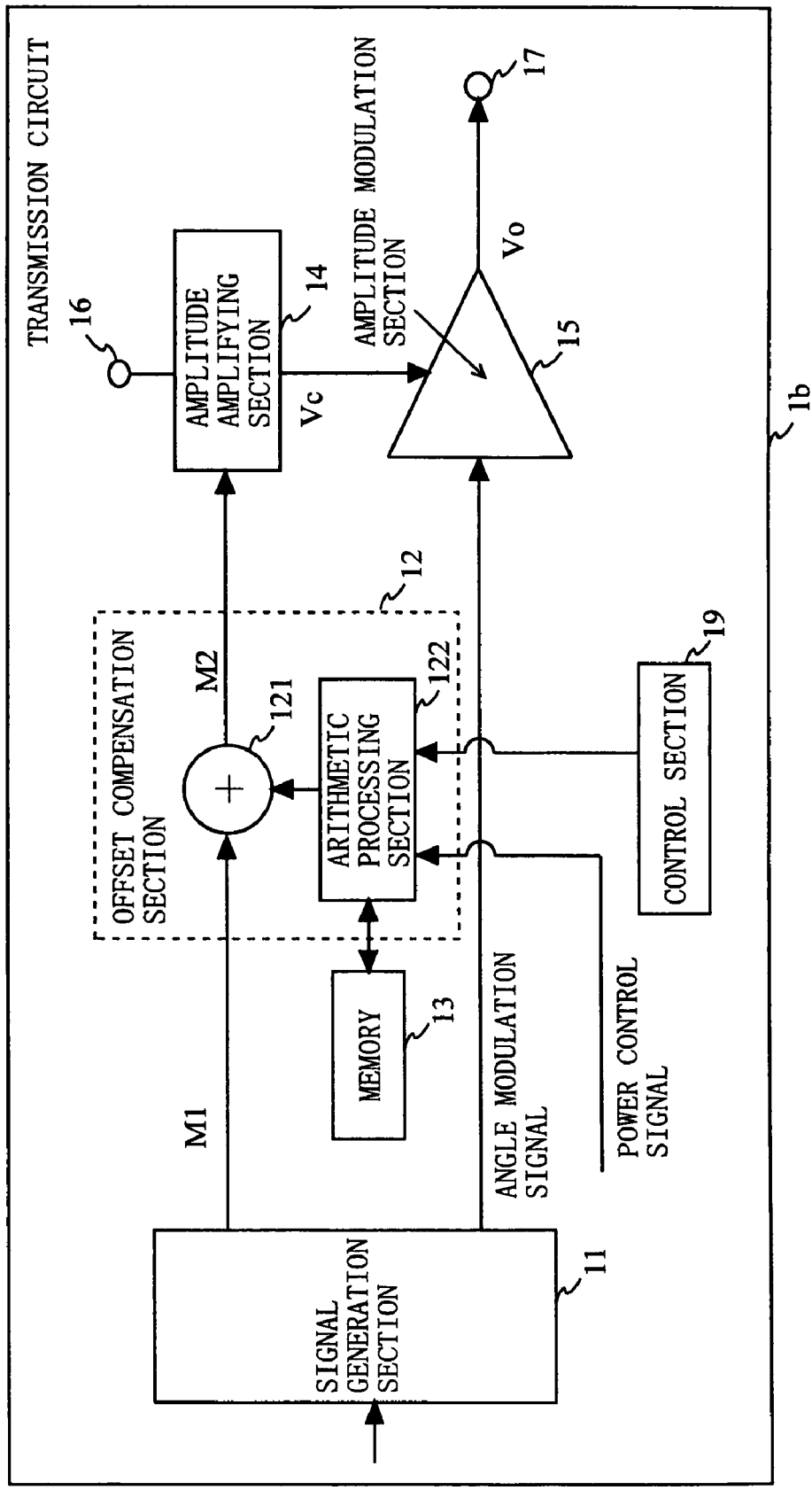
FIG. 1B is a block diagram showing an exemplary configuration of a transmission circuit 1b according to the first embodiment of the present invention.

In the above-described transmission circuit 1, the arithmetic processing section 122 reads the offset compensation value from the memory 13 in accordance with a measured value of the output power of the amplitude modulation section 15. However, similarly to, e.g., a transmission circuit 1b shown in FIG. 1B, the arithmetic processing section 122 may read, from the memory 13, an offset compensation value in accordance with a power control signal transmitted from a baseband section (not shown). In this case also, the amplitude signal M1 is compensated for by using an offset compensation value corresponding to a characteristic of the amplitude modulation section 15 of each individual transmission circuit 1b. As a result, the transmission circuit 1b produces the same effects as those obtained in the case where the offset compensation value is read from the memory 13 in accordance with the measured value of the output power of the amplitude modulation section 15.

Next, the method of calculating the offset compensation value of the amplitude modulation section 15 will be described. FIG. 3 shows a flow of an exemplary method of calculating the offset compensation value. When, e.g., the power is turned on, or at factory setting, the control section 19 instructs, as shown in FIG. 3, the offset compensation section 12 and power measuring section 18 to calculate the offset compensation value of the amplitude modulation section 15. When instructed by the control section 19 to calculate the offset compensation value, the offset compensation section 12 outputs the amplitude signal M2 of an arbitrary magnitude. In response, the amplitude modulation section 15 outputs a modulation signal corresponding to the amplitude signal M2. In accordance with the instruction from the control section 19, the power measuring section 18 measures the output power of the amplitude modulation section 15. Next, the offset compensation section 12 outputs the amplitude signal M2 having been changed in magnitude, and at this point, the power measuring section 18 measures the output power of the amplitude modulation section 15. The offset compensation section 12 reiterates the above-described operation for n times. Here, n is an arbitrary natural number no less than 1.

Figure 4A:
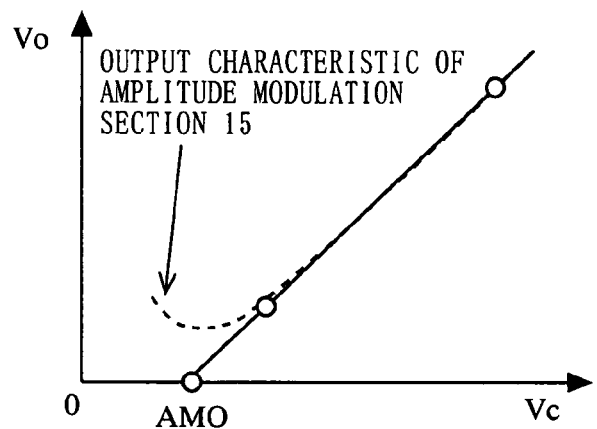
FIG. 4A illustrates a method of calculating the offset compensation value by straight-line approximation between two points.
Figure 4B:
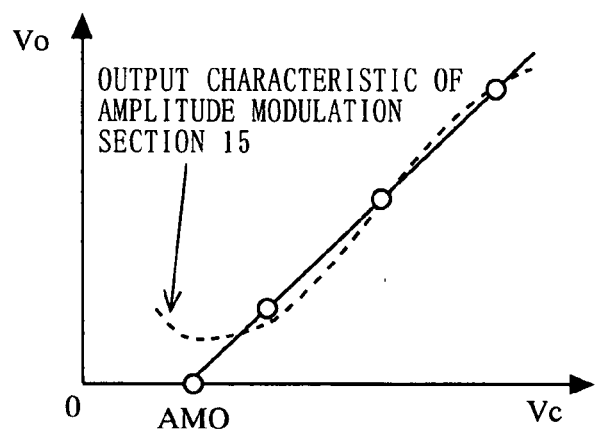
FIG. 4B illustrates a method of calculating the offset compensation value by straight-line approximation of three points, the straight-line approximation using a least squares method.
Figure 4C:
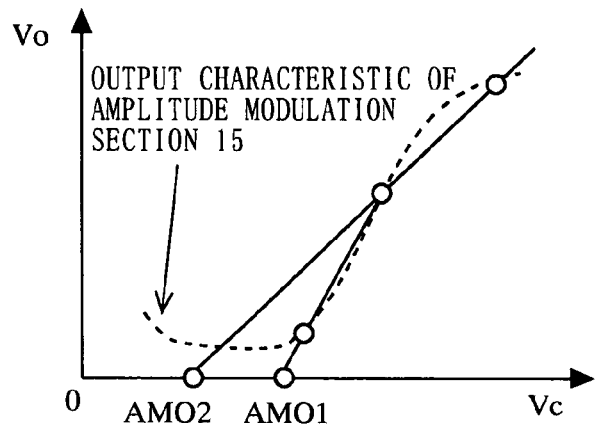
FIG. 4C illustrates a method of calculating a plurality of offset compensation values by straight-line approximation between two points.

In the offset compensation section 12, the arithmetic processing section 122 performs a predetermined calculation based on the output power of the amplitude modulation section 15 which has been repeatedly measured, thereby calculating the offset compensation value. Hereinafter, a method by which the arithmetic processing section 122 calculates the offset compensation value will be described with reference to FIGS. 4A to 4C. In FIGS. 4A to 4C, a longitudinal axis represents the output voltage Vo of the amplitude modulation section 15, and a horizontal axis represents the collector voltage Vc inputted to the amplitude modulation section 15. Also, a dotted line represents an output characteristic of the amplitude modulation section 15.

FIG. 4A illustrates a method of calculating the offset compensation value by straight-line approximation between two points. As shown in FIG. 4A, the arithmetic processing section 122 extends a line connecting two points each representing the output voltage Vo of the amplitude modulation section 15, which two points have been measured by changing a magnitude of the collector voltage Vc (i.e., amplitude signal M2), and then the arithmetic processing section 122 calculates, as an offset compensation value AMO, an intersection point of the extended line and the horizontal axis.

FIG. 4B illustrates a method of calculating the offset compensation value by straight-line approximation of three points, the straight-line approximation using a least squares method. As shown in FIG. 4B, the arithmetic processing section 122 uses the least squares method to extend an approximate straight-line connecting three points each representing the output voltage Vo of the amplitude modulation section 15, which three points have been measured by changing the magnitude of the collector voltage Vc (i.e., amplitude signal M2), and then the arithmetic processing section 122 calculates, as the offset compensation value AMO, an intersection point of the extended line and the horizontal axis. Note that, the arithmetic processing section 122 is able to calculate the offset compensation value AMO by straight-line approximation using the least squares method even if the number of points is four or more.

FIG. 4C illustrates a method of calculating a plurality of offset compensation values by straight-line approximation between two points. As shown in FIG. 4C, the arithmetic processing section 122 extends a line connecting two points each representing the output voltage Vo of the amplitude modulation section 15, which two points have been measured by changing the magnitude of the collector voltage Vc (i.e., amplitude signal M2), and then the arithmetic processing section 122 calculates, as a first offset compensation value AMO1, an intersection point of the extended line and the horizontal axis. Further, the arithmetic processing section 122 extends a line connecting other two points each representing the output voltage Vo of the amplitude modulation section 15 which has been measured, and then calculates, as a second offset compensation value AMO2, an intersection point of the extended line and the horizontal axis. This calculation method is useful in the case where the amplitude modulation section 15 has different offset compensation values for different output powers, respectively.

Figure 5A:
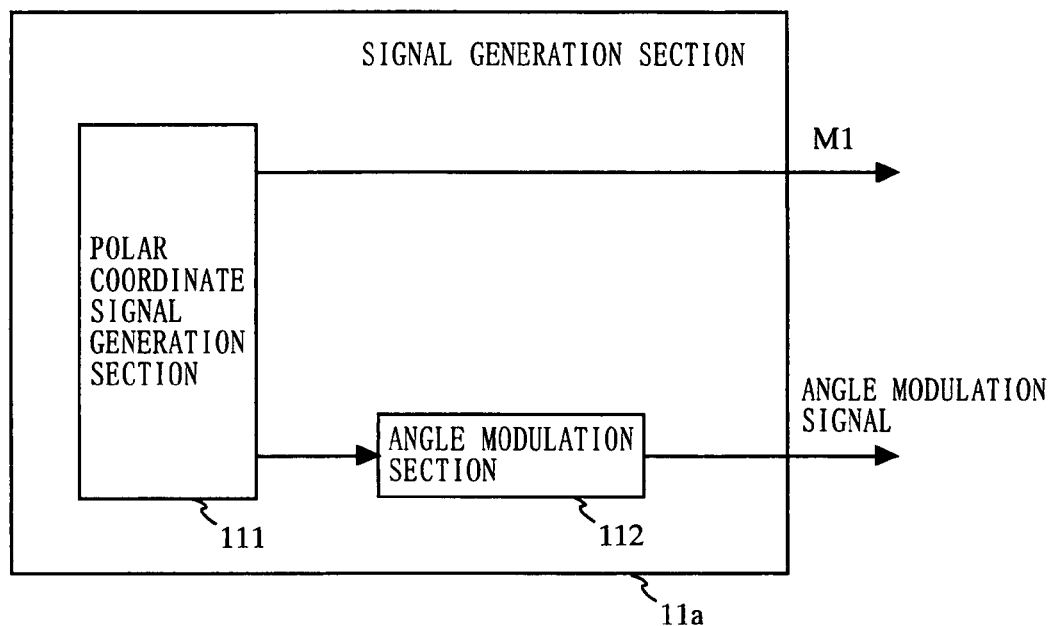
FIG. 5A is a block diagram showing an exemplary configuration of a signal generation section 11a in which a polar coordinate signal generation section is used.

Next, configurations of the signal generation section 11, amplitude amplifying section 14 and amplitude modulation section 15 will be described in detail. The signal generation section 11 may be configured by using, for example, a polar coordinate signal generation section for generating a polar coordinate signal. FIG. 5A is a block diagram showing an exemplary configuration of a signal generation section 11a in which the polar coordinate signal generation section is used. In FIG. 5A, the signal generation section 11a includes a polar coordinate signal generation section 111 and an angle modulation section 112. The polar coordinate signal generation section 111 performs signal processing on input data, thereby generating the amplitude signal M1 and a phase signal which are polar coordinate signals. The angle modulation section 112 angle-modulates the phase signal to output an angle modulation signal.

Figure 5B:
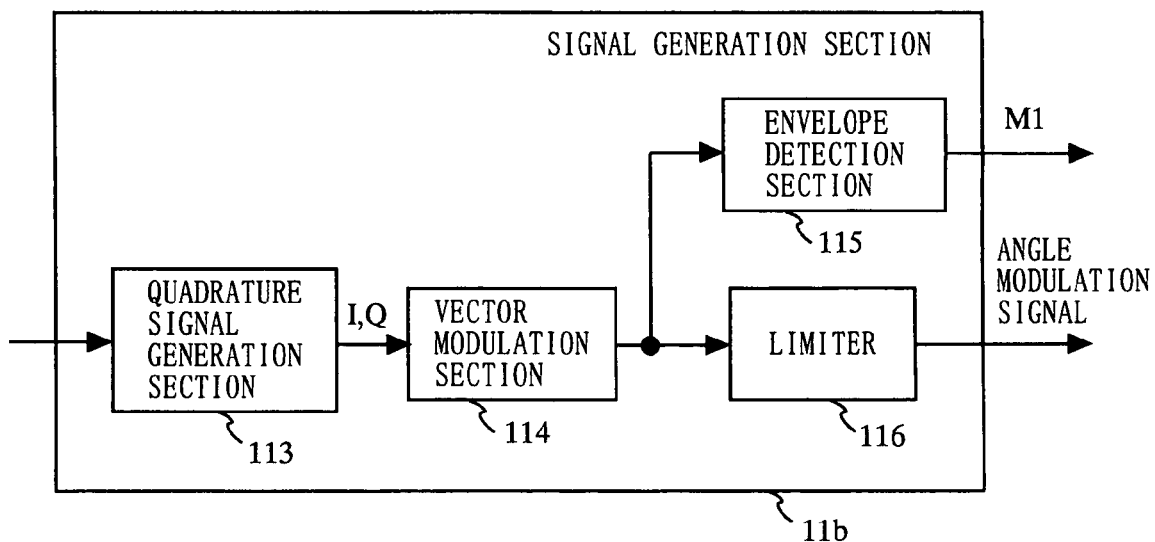
FIG. 5B is a block diagram showing an exemplary configuration of a signal generation section 11b in which a quadrature signal generation section is used.

Further, the signal generation section 11 may be configured by using, e.g., a quadrature signal generation section for generating a quadrature signal. FIG. 5B is a block diagram showing an exemplary configuration of a signal generation section 11b in which the quadrature signal generation section is used. As shown in FIG. 5B, the signal generation section 11b includes a quadrature signal generation section 113, vector modulation section 114, envelope detection section 115 and a limiter 116. The quadrature signal generation section 113 performs signal processing on input data, thereby generating an IQ signal which is a quadrature signal. The IQ signal is inputted to the vector modulation section 114. The vector modulation section 114 vector-modulates the IQ signal. For the vector modulation section 114, a quadrature modulator is used, for example. A signal outputted from the vector modulation section 114 is inputted to the envelope detection section 115 and limiter 116. The envelope detection section 115 detects an envelope component of the signal outputted from the vector modulation section 114, and outputs the detected envelope component as the amplitude signal M1. The limiter 116 limits, to a particular magnitude, the envelope component of the signal outputted from the vector modulation section 114, and outputs a resultant signal as an angle modulation signal.

Figure 6A:
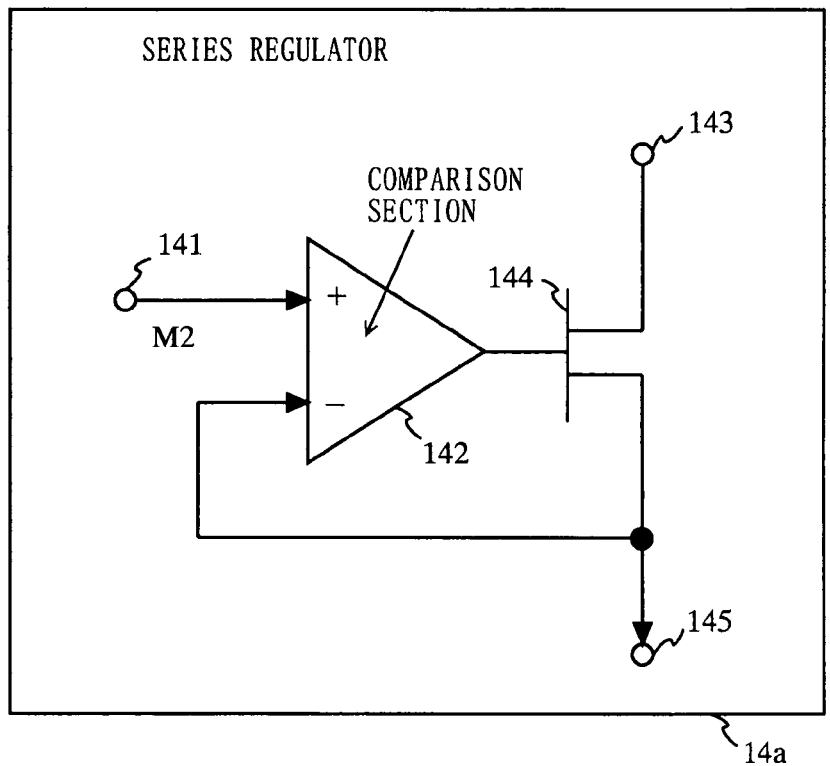

The amplitude amplifying section 14 may be configured by, for example, a series regulator. FIG. 6A is a block diagram showing an exemplary configuration of a series regulator 14a. In FIG. 6A, the series regulator 14a includes an input terminal 141, comparing section 142, power supply terminal 143, transistor 144 and an output terminal 145. Here, the transistor 144 is an electric field effect transistor. To the input terminal 141, the amplitude signal M2 is inputted via the offset compensation section 12. The amplitude signal M2 is inputted to a gate terminal of the transistor 144 via the comparing section 142. To a drain terminal of the transistor 144, a DC voltage is supplied from the power supply terminal 143.

The transistor 144 outputs, from a source terminal, a voltage proportional to the magnitude of the inputted amplitude signal M2. The voltage outputted from the source terminal of the transistor 144 is fed back to the comparing section 142. Based on the fed back voltage, the comparing section 142 adjusts the magnitude of the amplitude signal M2 to be inputted to the gate terminal of the transistor 144. The above manner allows the series regulator 14a to stably supply, from the output terminal 145, the voltage corresponding to the magnitude of the amplitude signal M2. Note that the same effect as described above is obtained even if the transistor 144 is a bipolar transistor. Using the series regulator 14a as the amplitude amplifying section 14 enables the transmission circuit 1 to operate over a wide band.

Figure 6B:
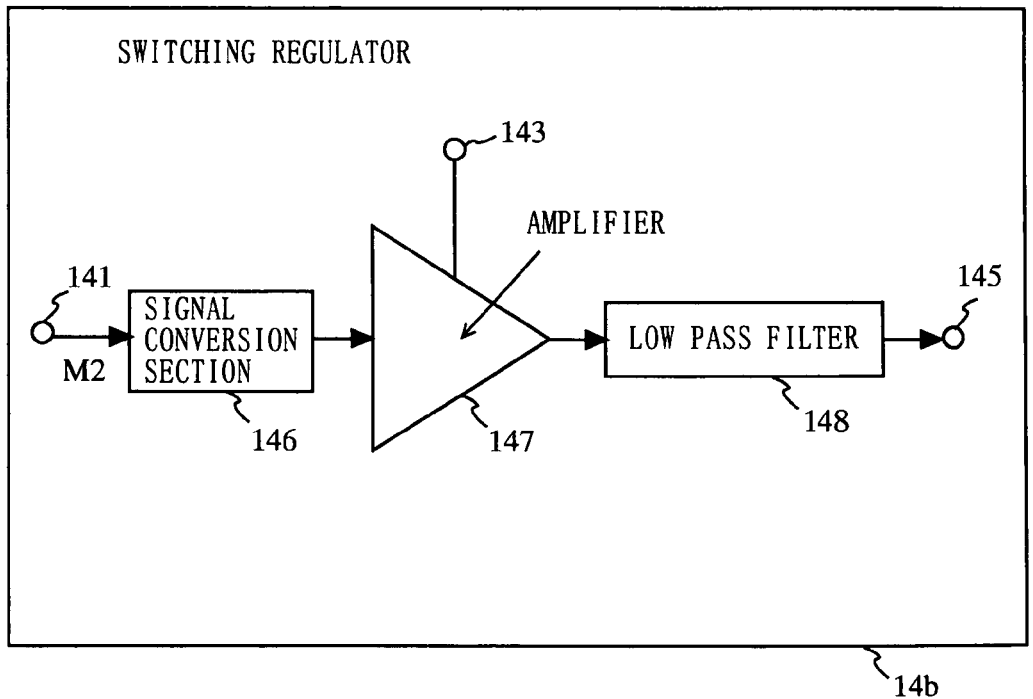
FIG. 6B is a block diagram showing an exemplary configuration of a switching regulator 14b.

Further, the amplitude amplifying section 14 may be configured by, e.g., a switching regulator. FIG. 6B is a block diagram showing an exemplary configuration of a switching regulator 14b. In FIG. 6B, the switching regulator 14b includes the input terminal 141, the power supply terminal 143, a signal conversion section 146, an amplifier 147, a low-pass filter 148 and the output terminal 145. To the input terminal 141, the amplitude signal M2 is inputted via the offset compensation section 12. The amplitude signal M2 is inputted to the signal conversion section 146. The signal conversion section 146 converts the inputted amplitude signal M2 by performing PWM and delta sigma modulation thereon. The signal converted in the signal conversion section 146 is inputted to the amplifier 147. The amplifier 147 amplifies the inputted signal, and outputs the signal. Note that, a DC voltage is supplied from the power supply terminal 143 to the amplifier 147, and a high efficiency switching amplifier such as a D-class amplifier is used for the amplifier 147.

The signal outputted from the amplifier 147 is inputted to the low-pass filter 148. The low-pass filter 148 removes, from the signal outputted from the amplifier 147, spurious components such as a quantization noise and switching noise. The signal, whose spurious components have been removed by the low-pass filter 148, is outputted from the output terminal 145 as a voltage corresponding to the magnitude of the amplitude signal M2. Here, the switching regulator 14b may feed back the signal, which is outputted from the low-pass filter 148, to the signal conversion section 146 so as to stabilize the voltage to be outputted. Using the switching regulator 14b, which operates with high efficiency, for the amplitude amplifying section 14 allows power consumption of the transmission circuit 1 to be reduced.

Figure 6C:
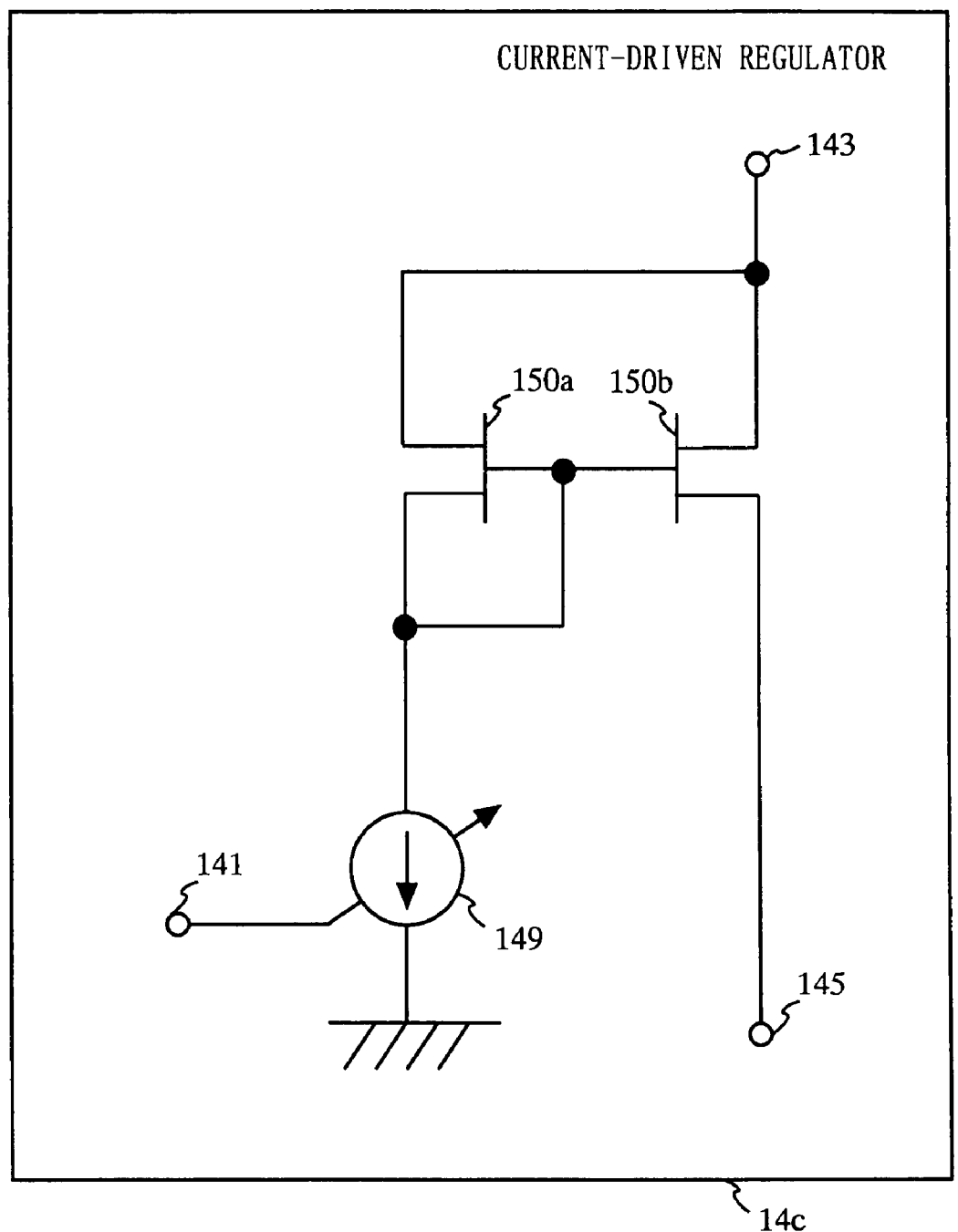
FIG. 6C is a block diagram showing an exemplary configuration of a current-driven regulator 14c.

Further, the amplitude amplifying section 14 may be configured by, e.g., a current-driven regulator. FIG. 6C is a block diagram showing an exemplary configuration of a current-driven regulator 14c. In FIG. 6C, the current-driven regulator 14c includes an input terminal 141, power supply terminal 143, variable current source 149, transistor 150a, transistor 150b and an output terminal 145. The amplitude signal M2 is inputted to the input terminal 141 via the offset compensation section 12. To the power supply terminal 143, a DC voltage is supplied. The amplitude signal M2 inputted via the input terminal 141 is outputted from the output terminal 145, as an electric current corresponding to the magnitude of the amplitude signal M2, via the variable current source 149, transistor 150a and transistor 150b. The current-driven regulator 14c as described above is useful when the amplitude modulation section 15 is configured by a bipolar transistor. Here, the transistors 150a and 150b may be electric field effect transistors or bipolar transistors.

The amplitude modulation section 15 may be configured, for example, as shown in FIG. 7A. FIG. 7A is a block diagram showing an exemplary configuration of the amplitude modulation section 15a. As shown in FIG. 7A, the amplitude modulation section 15a includes an input terminal 151, matching circuit 152, bias circuit 153, power supply terminal 154, transistor 155, bias circuit 156, input terminal 157, matching circuit 158 and an output terminal 159. Here, the transistor 155 is a bipolar transistor. To the input terminal 151, the angle modulation signal is inputted from the signal generation section 11. The angle modulation signal is inputted to a base terminal of the transistor 155 via the matching circuit 152.

A DC voltage is applied to the power supply terminal 154. In other words, to the base terminal of the transistor 155, a bias voltage is supplied via the power supply terminal 154 and bias circuit 153. To the input terminal 157, a voltage corresponding to the magnitude of the amplitude signal M2 is supplied from the amplitude amplifying section 14. The voltage corresponding to the magnitude of the amplitude signal M2 is supplied to a collector terminal of the transistor 155 via the bias circuit 156. The transistor 155 amplitude-modulates the angle modulation signal by using the voltage corresponding to the magnitude of the amplitude signal M2, and then outputs a resultant signal as a modulation signal.

The modulation signal outputted from the transistor 155 is outputted from the output terminal 159 via the matching circuit 158. Note that, even if the transistor 155 is an electric field effect transistor, the same effect as that obtained in the case of using a bipolar transistor as the transistor 155 is obtained. In the case where the amplitude amplifying section 14 is configured by the current-driven regulator 14c, an electric current corresponding to the magnitude of the amplitude amplifying signal M2 is inputted from the current-driven regulator 14c to the power supply terminal 154. In this case, the electric current corresponding to the magnitude of the amplitude amplifying signal M2 is inputted to the collector terminal of the transistor 155 via the bias circuit 156. The transistor 155 amplitude-modulates the angle modulation signal by using the electric current corresponding to the magnitude of the amplitude signal M2, and then outputs a resultant signal as a modulation signal.

Figure 7B:
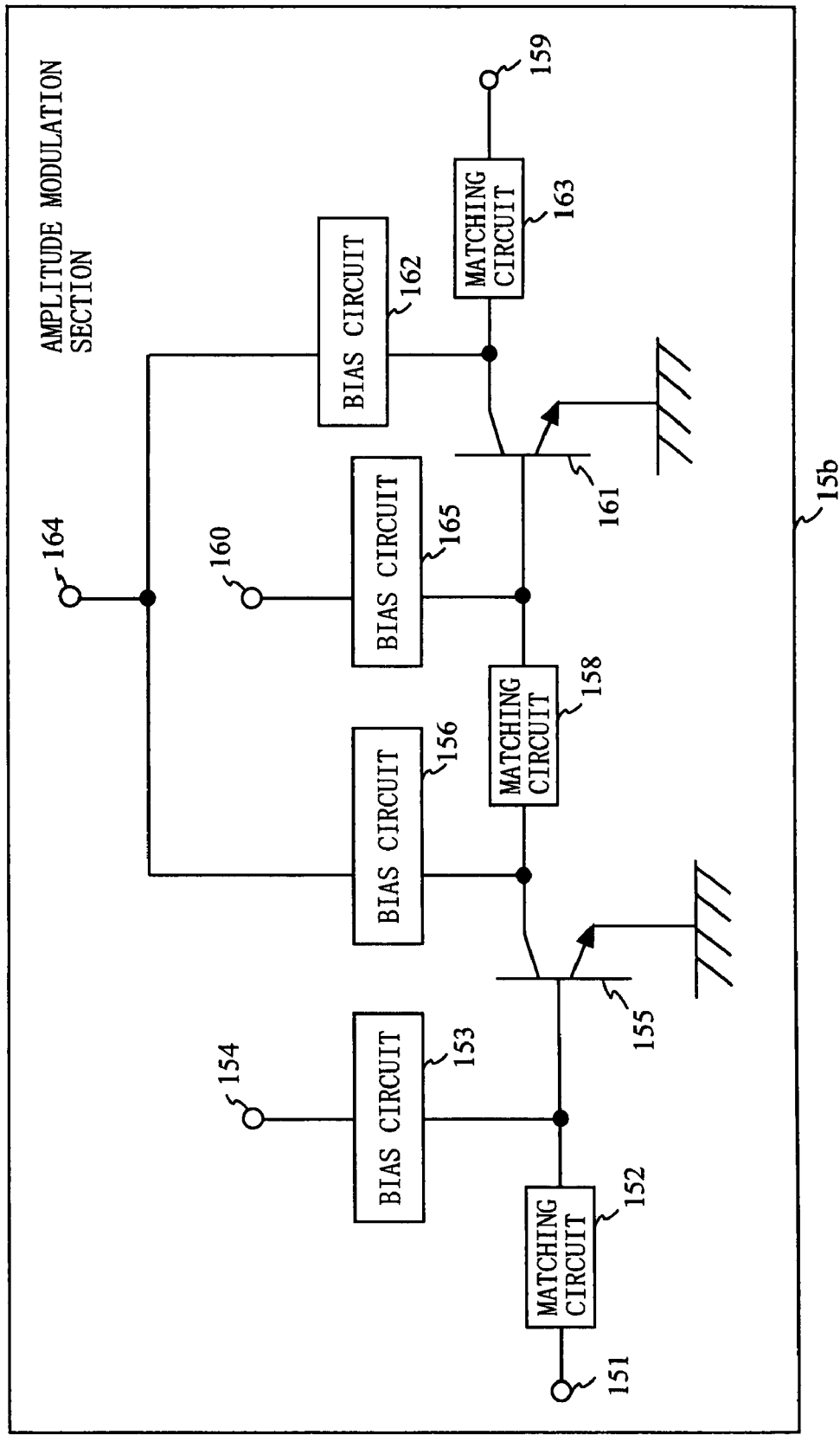
FIG. 7B is a block diagram showing an exemplary configuration of an amplitude modulation section 15b.

Further, the amplitude modulation section 15 may be configured, for example, as shown in FIG. 7B. FIG. 7B is a block diagram showing an exemplary configuration of an amplitude modulation section 15b. Fundamentally, the amplitude modulation section 15b of FIG. 7B has a configuration in which two amplitude modulation sections 15a (see FIG. 7A) are serially connected. A bias voltage is supplied from the power supply terminal 154 to the base terminal of the transistor 155 via the bias circuit 153. A bias voltage is supplied from a power supply terminal 160 to a base terminal of the transistor 161 via a bias circuit 165.

A voltage corresponding to the magnitude of the amplitude signal M2 is supplied from the amplitude amplifying section 14 to the collector terminal of the transistor 155 via a terminal 164 and the bias circuit 156. Also, the voltage corresponding to the magnitude of the amplitude signal M2 is supplied from the amplifying section 14 to a collector terminal of the transistor 161 via the terminal 164 and a bias circuit 162. This configuration allows the amplitude modulation section 15b to output a modulation signal having a greater dynamic range than that of the modulation signal of the amplitude modulation section 15a as shown in FIG. 7A. Note that, although the transistor in the amplitude modulation section 15 is a bipolar transistor, the same effect as described above is obtained even if the transistor is an electric field effect transistor. Moreover, the voltages supplied to the two bias circuits 156 and 162 are not necessarily identical to each other. To be specific, a voltage supplied to one of the above bias circuits may be a fixed voltage, and a voltage supplied to the other bias circuit may correspond to the magnitude of the amplitude signal M2.

As described above, in the transmission circuit 1 according to the first embodiment of the present invention, the offset compensation section 12 adds, based on the output power of the amplitude modulation section 15, an offset compensation value to the amplitude signal M1, the offset compensation value corresponding to a characteristic of the amplitude modulation section 15 of each individual transmission circuit. Accordingly, even if an individual difference or the like of the amplitude modulation section 15 causes inconsistency of an output signal of the amplitude modulation section 15, the offset compensation section 12 is able to precisely compensate for the offset characteristic of the amplitude modulation section 15. As a result, the transmission circuit 1 is able to operate with low distortion and high efficiency over a wide output electric power range.

Although in the above example the transmission circuit 1 changes the offset compensation value for each output power of the amplitude modulation section 15, a single offset compensation value may be used for a plurality of different output powers in the case where offset compensation values for the plurality of different output powers are almost the same. This allows a memory capacity, circuit size and the like of the transmission circuit 1 to be reduced.

Second Embodiment

Figure 8A:
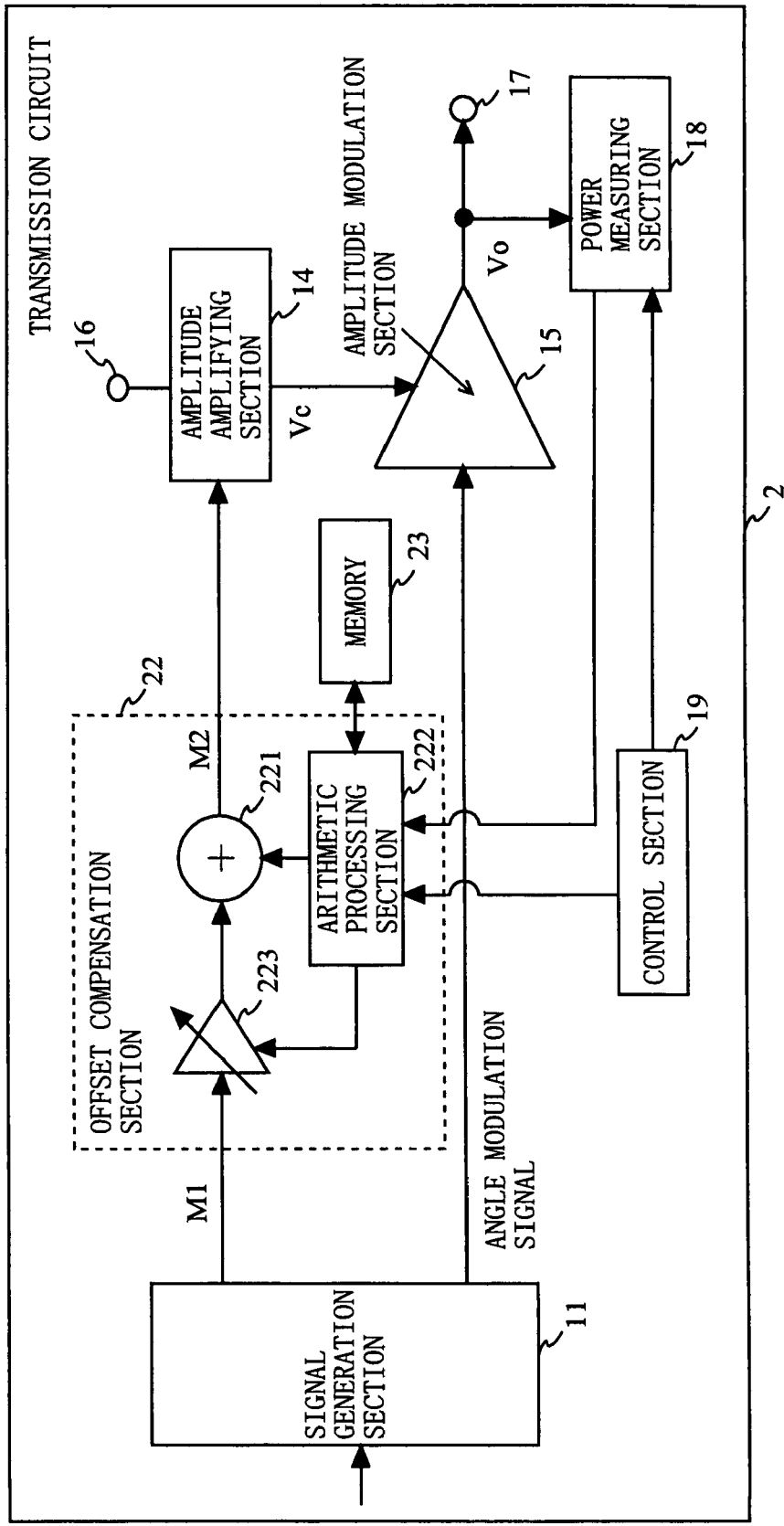
FIG. 8A is a block diagram showing an exemplary configuration of a transmission circuit 2 according to a second embodiment of the present invention.

FIG. 8A is a block diagram showing an exemplary configuration of a transmission circuit 2 according to a second embodiment of the present invention. As shown in FIG. 8A, the transmission circuit 2 is different from the transmission circuit 1 according to the first embodiment in that the configuration of the offset compensation section 22 and stored contents of the memory 23 are different from those of the offset compensation section 12 and memory 13. The offset compensation section 22 includes an adder 221, arithmetic processing section 222 and variable gain amplifier 223. In response to an instruction from the arithmetic processing section 222, the variable gain amplifier 223 amplifies the amplitude signal M1 by a predetermined gain, and compensates for a gradient of the output characteristic (hereinafter, referred to as an offset characteristic gradient) of the amplitude modulation section 15, the gradient occurring due to an individual difference or the like of the amplitude modulation section 15.

The memory 23 stores an offset compensation value for compensating for the offset characteristic of the amplitude modulation section 15, and a gain for compensating for the offset characteristic gradient of the amplitude modulation section 15 (i.e., a gain of the variable gain amplifier 223). FIG. 9 shows an example of stored contents of the memory 23. As shown in FIG. 9, the memory 23 stores offset compensation values (e.g., AMO1, AMO2 and AMO3), which correspond to output powers of the amplitude modulation section 15 (e.g., output voltages Vo1, Vo2 and Vo3 of the amplitude modulation section 15), and gains of the variable gain amplifier 223 (e.g., Gain 1, Gain 2 and Gain 3). The offset compensation values and the gains of the variable gain amplifier 223 may be prestored in the memory 23, or may be calculated by a predetermined method. The method of calculating the offset compensation values and the gains of the variable gain amplifier 223 will be described later in detail.

Similarly to the first embodiment, the output power of the amplitude modulation section 15, which has been measured by the power measuring section 18, is inputted to the arithmetic processing section 222. The arithmetic processing section 222 reads, from the memory 23, a gain corresponding to the output power of the amplitude modulation section 15, and sets the read gain for the variable gain amplifier 223. The variable gain amplifier 223 amplifies, in accordance with the set gain, the amplitude signal M1, and outputs a resultant signal. The arithmetic processing section 222 reads, from the memory 23, an offset compensation value corresponding to the output power of the amplitude modulation section 15, and outputs the offset compensation value to the adder 221. The adder 221 adds the offset compensation value, which has been outputted from the arithmetic processing section 222, to an output of the variable gain amplifier 223, and then outputs a resultant signal as the amplitude signal M2.

Figure 8B:
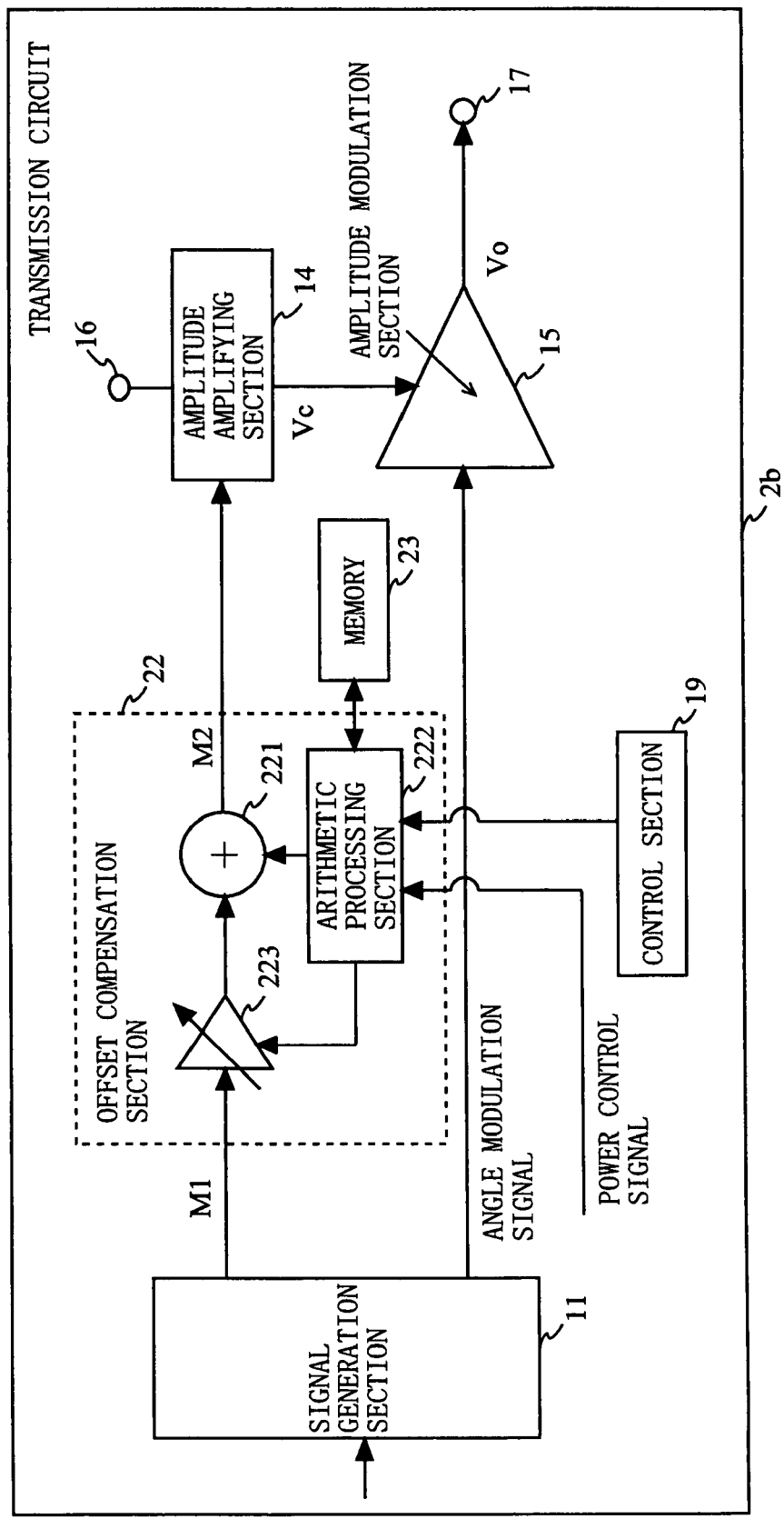
FIG. 8B is a block diagram showing an exemplary configuration of a transmission circuit 2b according to the second embodiment of the present invention.

In the above-described transmission circuit 2, the arithmetic processing section 222 reads, from the memory 23, an offset compensation value and a gain based on a measured value of the output power of the amplitude modulation section 15. However, similarly to, e.g., a transmission circuit 2b shown in FIG. 8B, the arithmetic processing section 222 may read, in accordance with a power control signal transmitted from a baseband section (not shown), an offset compensation value and a gain from the memory 23. In this case also, the amplitude signal M1 is compensated for by using an offset compensation value and a gain which correspond to a characteristic of the amplitude modulation section 15 of each individual transmission circuit 2b. As a result, the transmission circuit 2b produces the same effects as those obtained in the case where the offset compensation value and the gain are read from the memory 23 in accordance with the measured value of the output power of the amplitude modulation section 15.

Next, the method of calculating the offset compensation value of the amplitude modulation section 15 and the gain of the variable gain amplifier 223 will be described in detail. The method of calculating the offset compensation value is the same as that of the first embodiment. The offset compensation section 22 calculates the gain of the variable gain amplifier 223 by, e.g., the method described below. In the offset compensation section 22, the arithmetic processing section 222 is able to calculate, during the process of calculating the offset compensation value, a gradient of a line as shown in FIGS. 4A to 4C (i.e., the offset characteristic gradient of the amplitude modulation section 15). Then, the arithmetic processing section 222 calculates the gain of the variable gain amplifier 223 such that the calculated gradient of the line coincides with an ideal offset characteristic gradient of the amplitude modulation section 15. When the offset characteristic gradient of the amplitude modulation section 15 varies in accordance with magnitude of the output voltage Vo of the amplitude modulation section 15 as shown in FIG. 4C, the arithmetic processing section 222 may change the gain of the variable gain amplifier 223 in accordance with the magnitude of the output voltage Vo of the amplitude modulation section 15.

As described above, in the transmission circuit 2 according to the second embodiment of the present invention, the offset compensation section 22 amplifies the amplitude signal M1 in accordance with the output power of the amplitude modulation section 15 so as to compensate for the offset characteristic gradient of the amplitude modulation section 15. Accordingly, even if there is inconsistency of an output signal of the amplitude modulation section 15 due to an individual difference or the like of the amplitude modulation section 15, the offset compensation section 22 is able to precisely compensate for the offset characteristic of the amplitude modulation section 15. This enables the transmission circuit 2 to operate with low distortion.

Third Embodiment

Figure 10A:
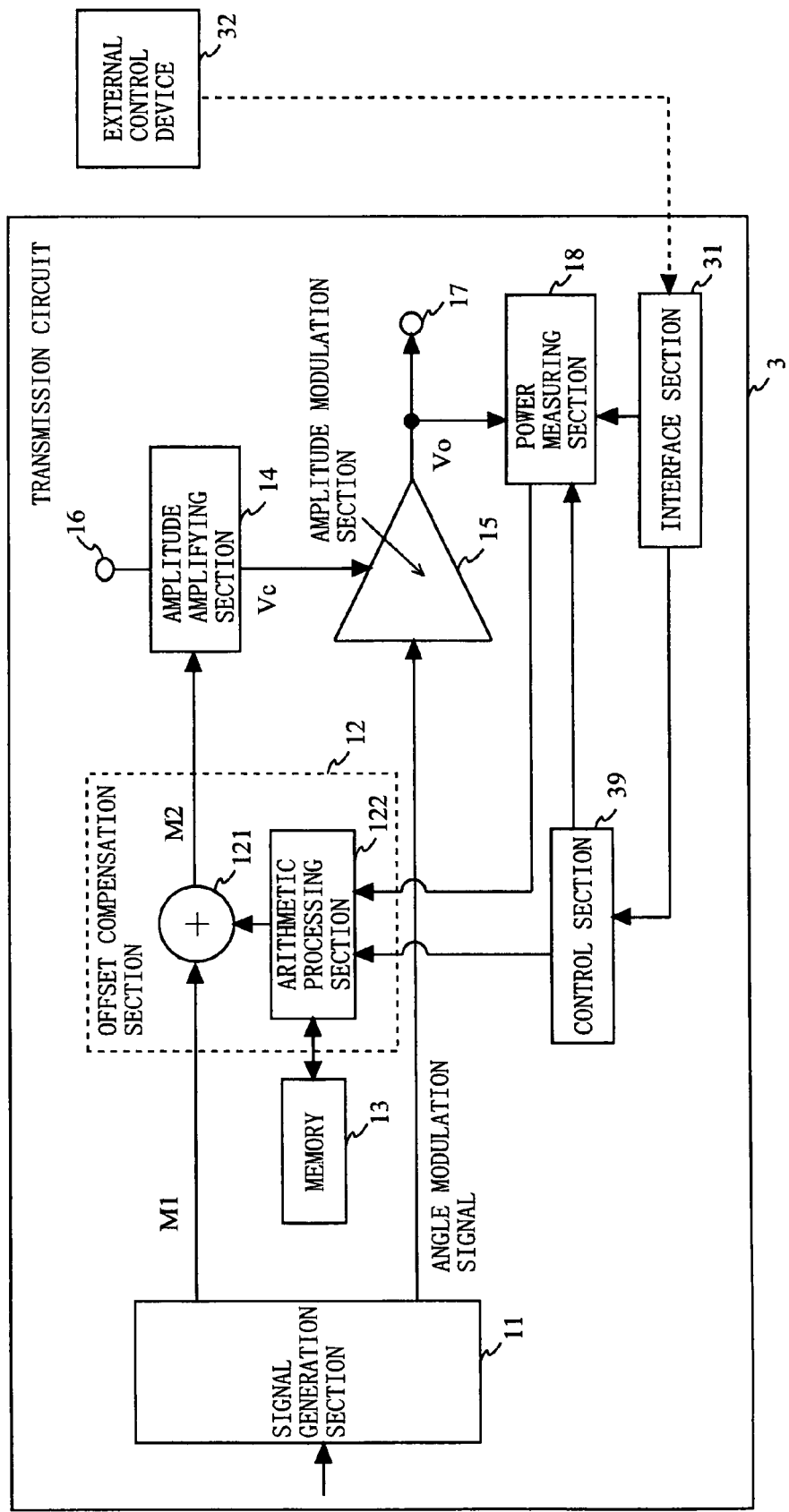
FIG. 10A is a block diagram showing an exemplary configuration of a transmission circuit 3 according to a third embodiment of the present invention.
Figure 10B:
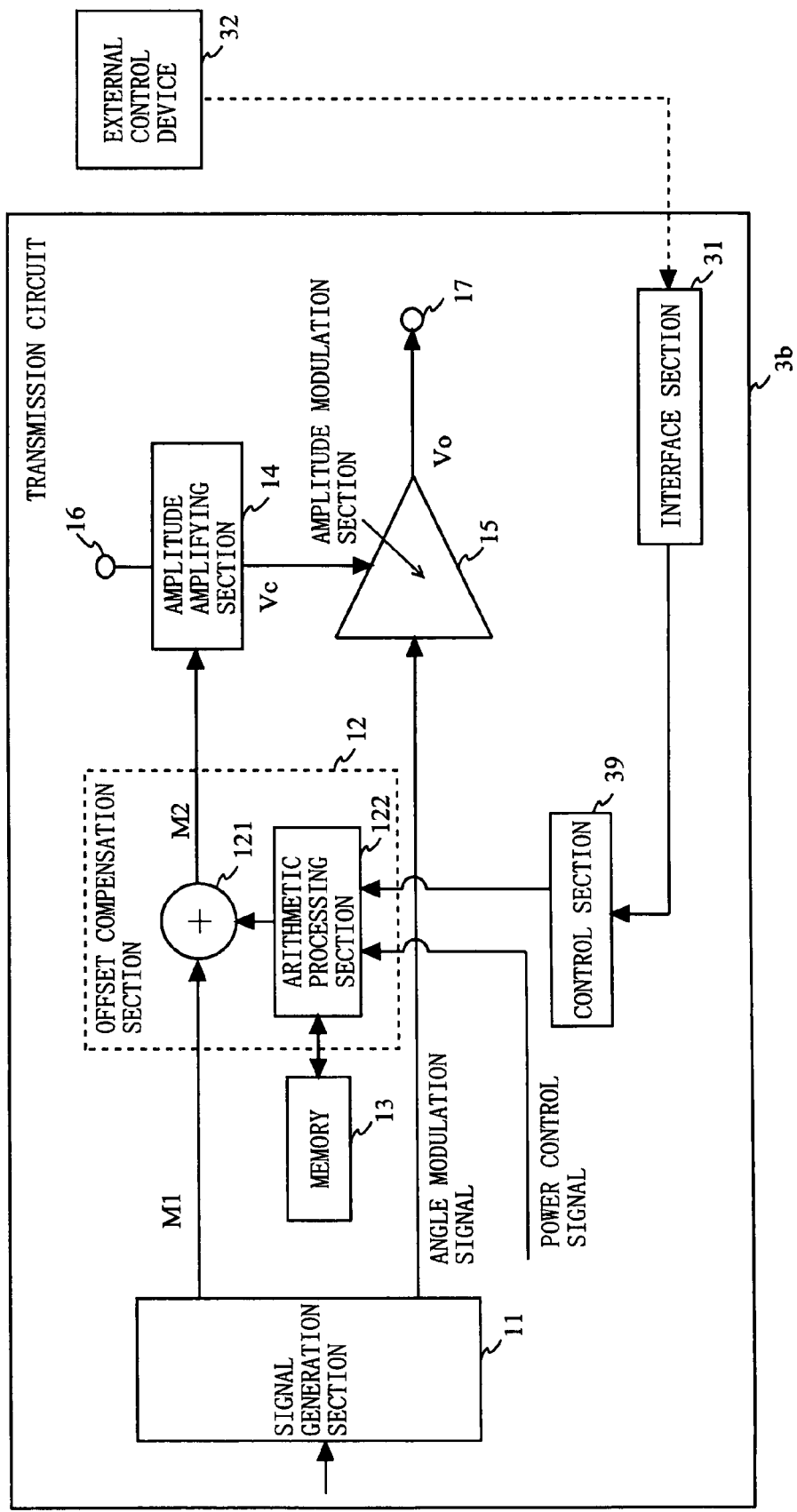
FIG. 10B is a block diagram showing an exemplary configuration of a transmission circuit 3b according to the third embodiment of the present invention.

FIG. 10A is a block diagram showing an exemplary configuration of a transmission circuit 3 according to a third embodiment of the present invention. As shown in FIG. 10A, the transmission circuit 3 further comprises an interface section 31 as compared with the transmission circuit 1 (see FIG. 1A) of the first embodiment. At initial setting, e.g., at factory setting, the transmission circuit 3 is connected to an external control device 32 via the interface section 31. The external control device 32 instructs, via the interface section 31, the power measuring section 18 and a control section 39 to calculate the offset compensation value of the amplitude modulation section 15. In response to the instruction, the control section 39 instructs the offset compensation section 12 to calculate the offset compensation value of the amplitude modulation section 15. The offset compensation section 12 and power measuring section 18 calculate the offset compensation value of the amplitude modulation section 15 in the same manner as that of the first embodiment. The above feature of the transmission circuit according to the third embodiment is applicable to the transmission circuit 1b (see FIG. 1B) of the first embodiment in a same manner as that of a transmission circuit 3b shown in FIG. 10B.

Figure 10C:
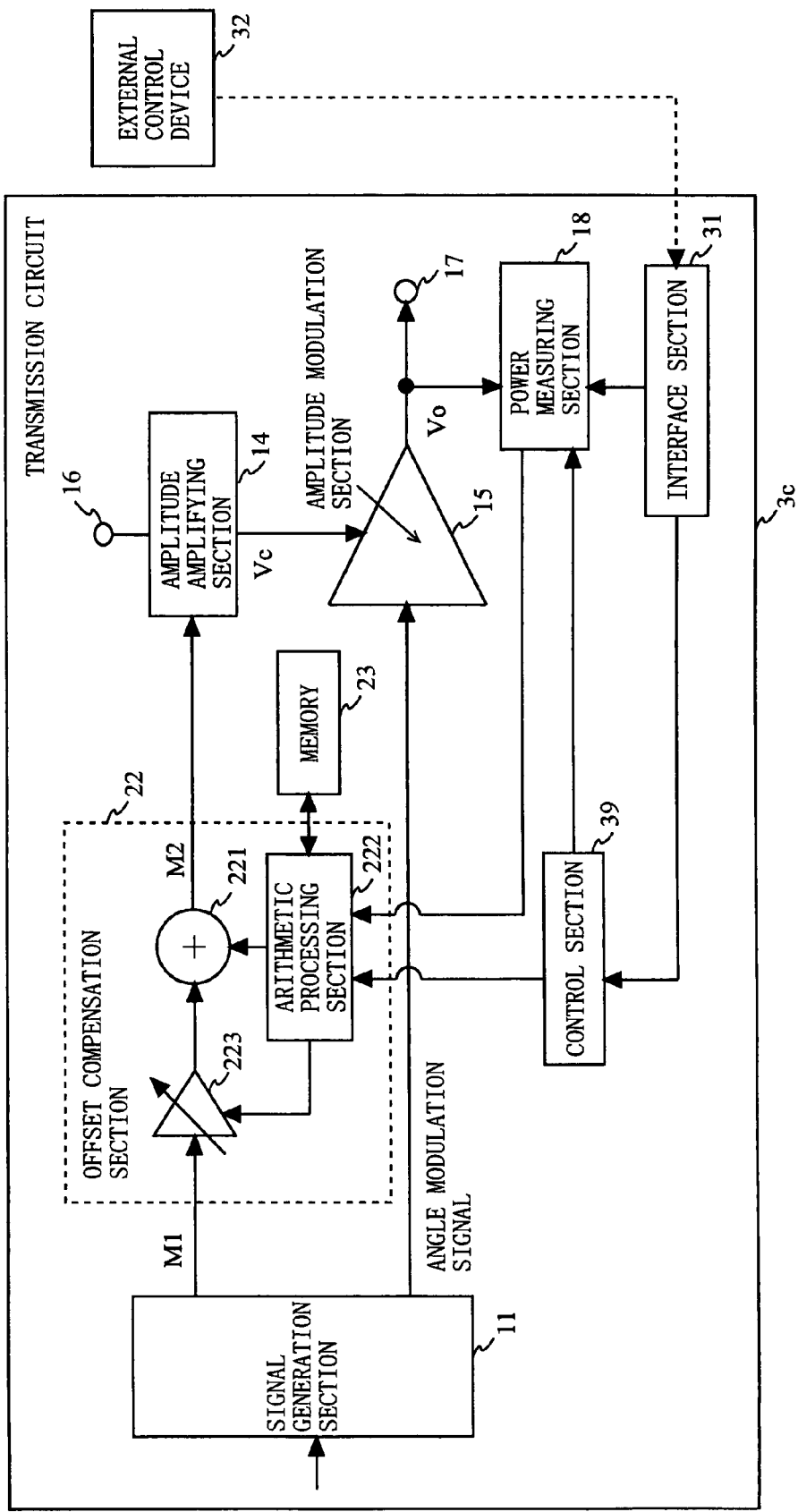
FIG. 10C is a block diagram showing an exemplary configuration of a transmission circuit 3c according to the third embodiment of the present invention.

Further, the above feature of the transmission circuit according to the third embodiment is applicable to the transmission circuit 2 (see FIG. 8A) of the second embodiment in a same manner as that of a transmission circuit 3c shown in FIG. 10C. FIG. 10C is a block diagram showing an exemplary configuration of the transmission circuit 3c according to the third embodiment of the present invention. Also in FIG. 10C, the transmission circuit 3c calculates, in response to an instruction from the external control device 32, the offset compensation value of the amplitude modulation section 15 and the gain of the variable gain amplifier 223. The above feature of the transmission circuit according to the third embodiment is further applicable to the transmission circuit 2b (see FIG. 8B) of the second embodiment in a same manner as that of a transmission circuit 3d shown in FIG. 10D.

As described above, the transmission circuit 3 according to the third embodiment of the present invention calculates, at initial setting, e.g., at factory setting, the offset compensation value of the amplitude modulation section 15 and the gain of the variable gain amplifier 223 in response to the instruction from the external control device 32. This allows the external control device 32 to have a part of functions of the control section 39 provided within the transmission circuit 3.

Fourth Embodiment

Figure 11A:
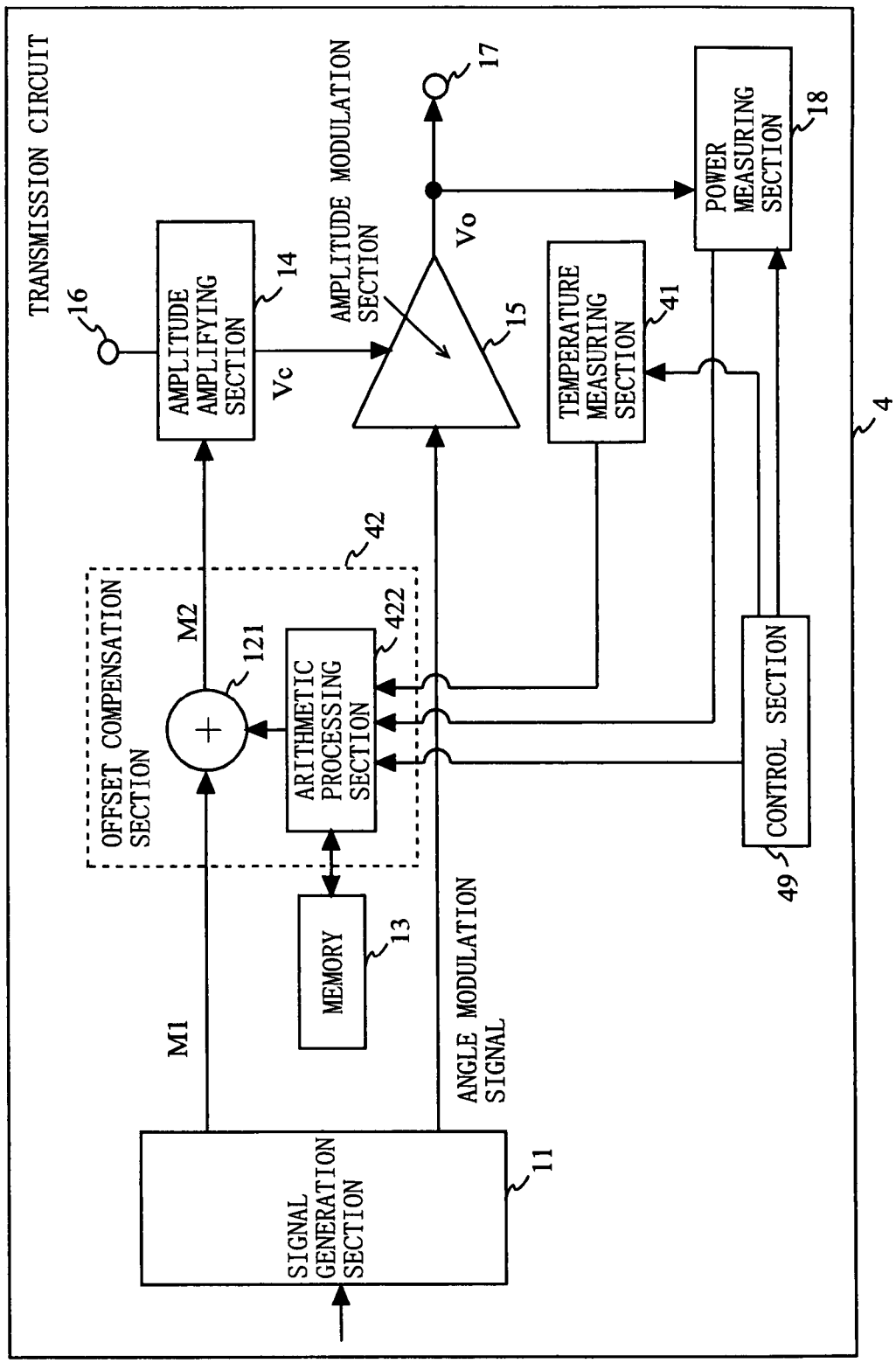
FIG. 11A is a block diagram showing an exemplary configuration of a transmission circuit 4 according to a fourth embodiment of the present invention.
Figure 11B:
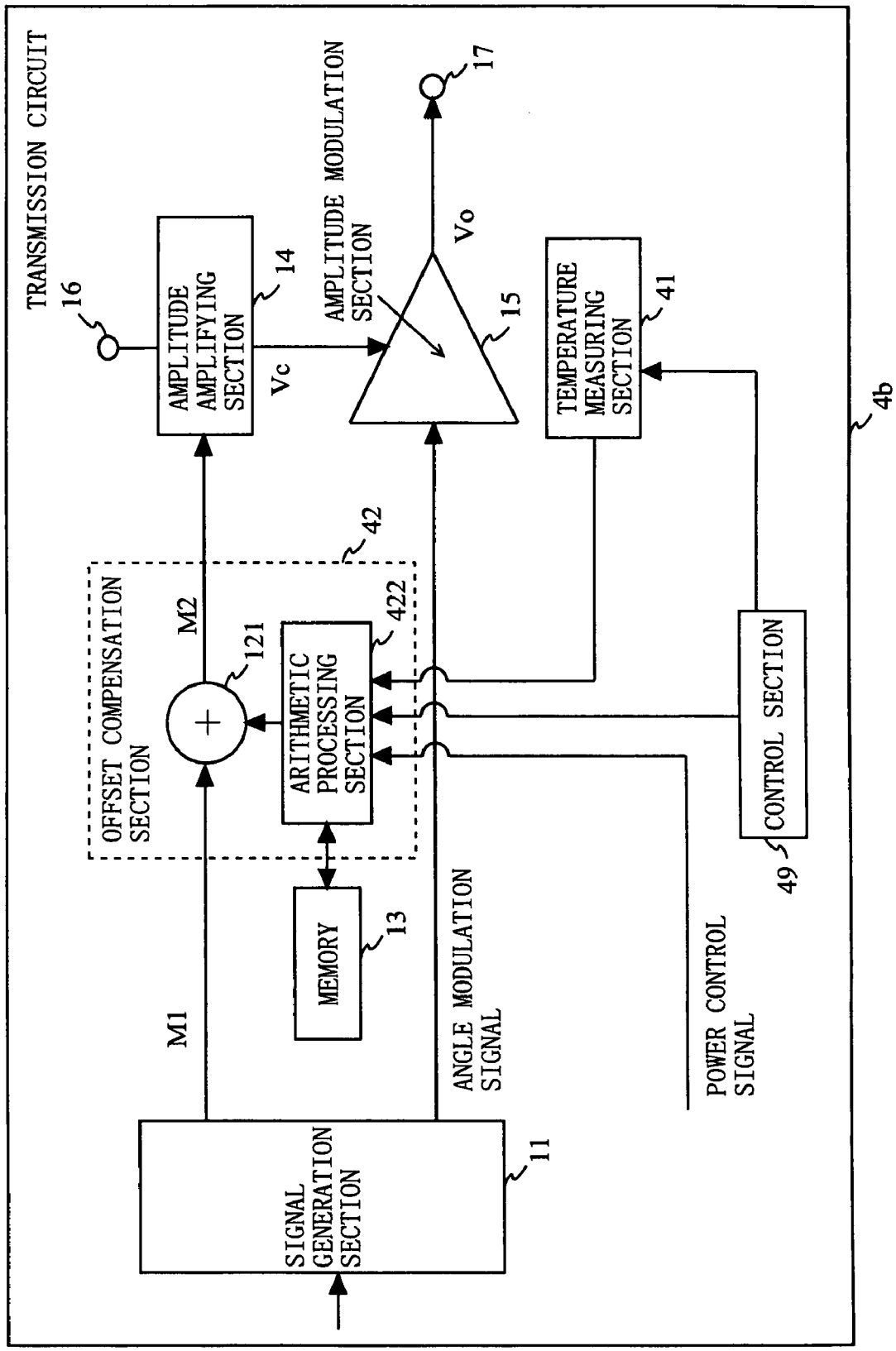
FIG. 11B is a block diagram showing an exemplary configuration of a transmission circuit 4b according to the fourth embodiment of the present invention.

FIG. 11A is a block diagram showing an exemplary configuration of a transmission circuit 4 according to a fourth embodiment of the present invention. The transmission circuit 4, shown in FIG. 11A, of the fourth embodiment is different from the transmission circuit 1 (see FIG. 1A) of the first embodiment in that the transmission circuit 4 is capable of updating, in real time, the offset compensation value stored in the memory 13 in accordance with the temperature of the amplitude modulation section 15. Also, the transmission circuit 4 further comprises a temperature measuring section 41. A control section 49 instructs the temperature measuring section 41 and an offset compensation section 42 about a timing of updating the offset compensation value stored in the memory 13. In response to the instruction from the control section 49, the temperature measuring section 41 measures a temperature of the amplitude modulation section 15. The offset compensation section 42 (arithmetic processing section 422) calculates, at the timing instructed by the control section 49, a new offset compensation value in consideration of the temperature of the amplitude modulation section 15. The arithmetic processing section 422 updates a stored content of the memory 13 with the calculated offset compensation value. The above feature of the transmission circuit according to the fourth embodiment is applicable to the transmission circuit 1b (see FIG. 1B) of the first embodiment in a same manner as that of a transmission circuit 4b shown in FIG. 11B.

Figure 11C:
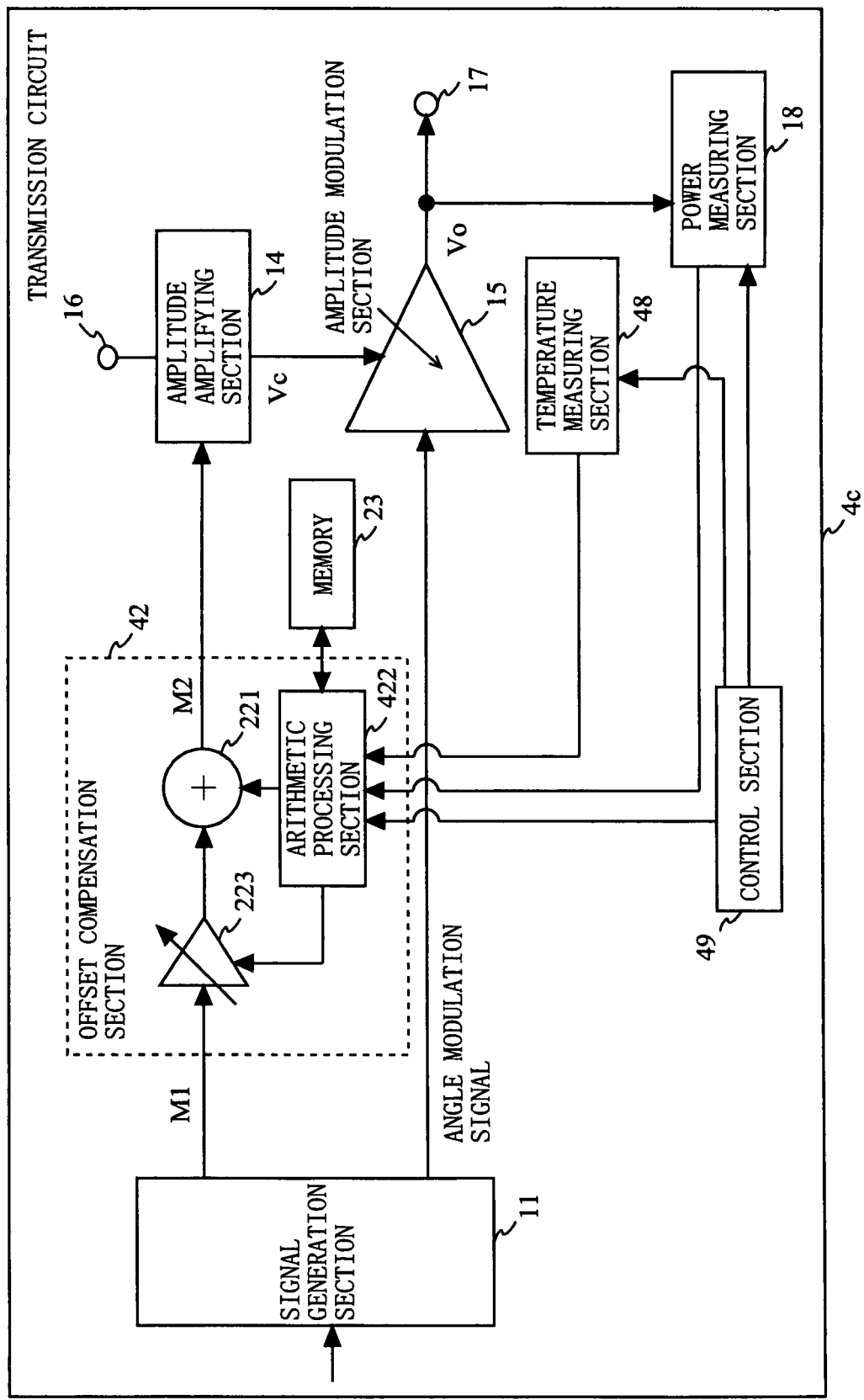
FIG. 11C is a block diagram showing an exemplary configuration of a transmission circuit 4c according to the fourth embodiment of the present invention.
Figure 11D:
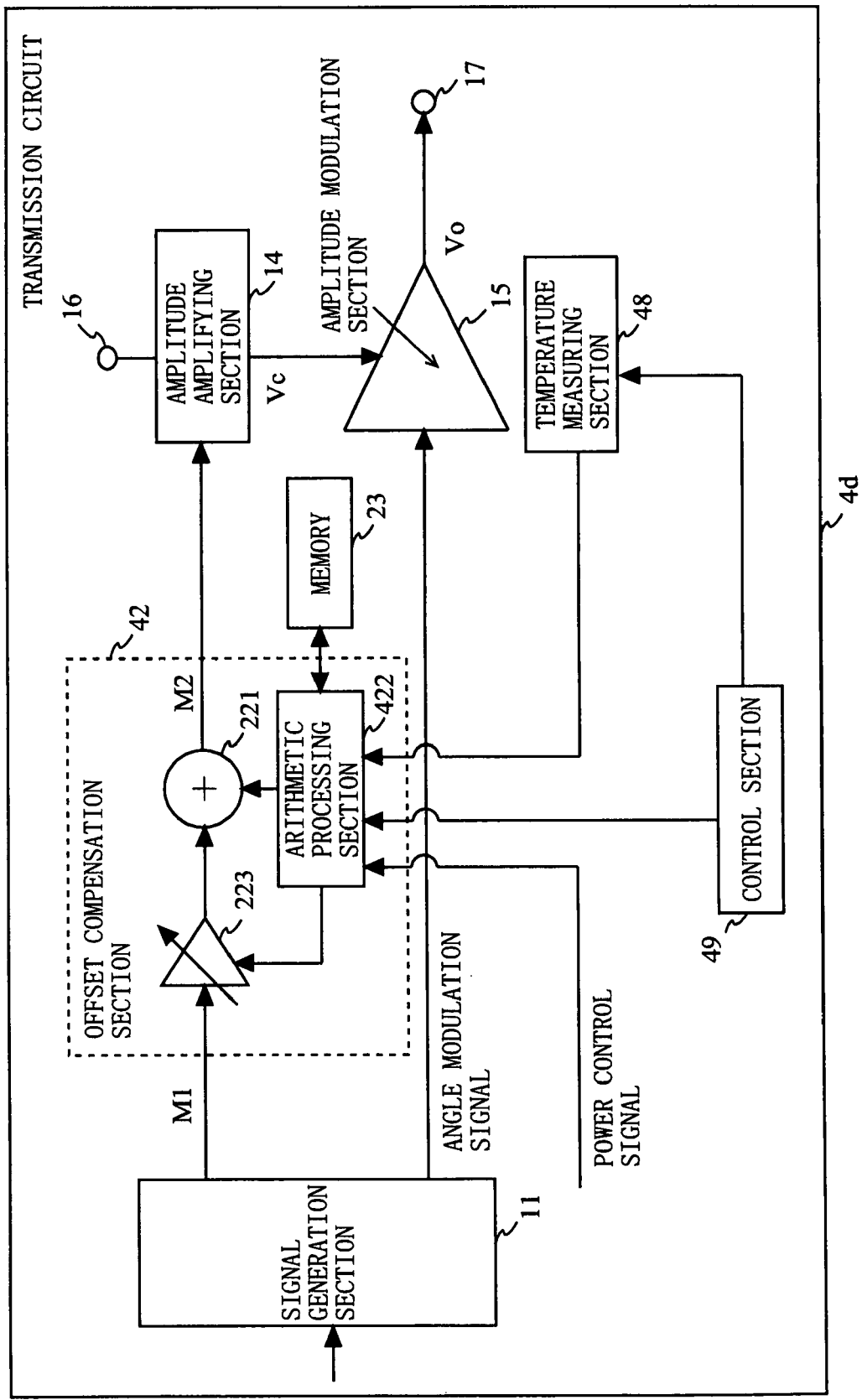
FIG. 11D is a block diagram showing an exemplary configuration of a transmission circuit 4d according to the fourth embodiment of the present invention.

Further, the above feature of the transmission circuit according to the fourth embodiment is applicable to the transmission circuit 2 (see FIG. 8A) of the second embodiment in a same manner as that of a transmission circuit 4c shown in FIG. 11C. FIG. 11C is a block diagram showing an exemplary configuration of the transmission circuit 4c according to the fourth embodiment of the present invention. The transmission circuit 4c shown in FIG. 11C is capable of updating in real time the offset compensation value and the gain, which are stored in the memory 23, in accordance with the temperature of the amplitude modulation section 15. Moreover, the above feature of the transmission circuit according to the fourth embodiment is applicable to the transmission circuit 2b (see FIG. 8B) of the second embodiment in a same manner as that of a transmission circuit 4d shown in FIG. 11D. In other words, in the case where the offset characteristic gradient of the amplitude modulation section 15 has changed in accordance with the temperature of the amplitude modulation section 15, the transmission circuits 4c and 4d according to the fourth embodiment may also update the gain of the variable gain amplifier 223 which is stored in the memory 23.

FIG. 12 illustrates a timing of updating the offset compensation value in the case where the transmission circuit 4 is applied to a TDMA system. As shown in FIG. 12, when the transmission circuit 4 is applied to a TDMA system, the control section 49 instructs the offset compensation section 42 and temperature measuring section 41 about a timing of updating the offset compensation value such that the updating of the offset compensation value is completed within, e.g., a TX ramp up time. This allows the transmission circuit 4 to update the offset compensation value without affecting transmission data. Further, the transmission circuit 4 is capable of compensating for, in a same time slot as that used for updating the offset compensation value, the offset characteristic of the amplitude modulation section 15, by using the updated offset compensation value.

FIG. 13 illustrates a timing of updating the offset compensation value in the case where the transmission circuit 4 is applied to a CDMA system. As shown in FIG. 13, when the transmission circuit 4 is applied to a CDMA system, the control section 49 instructs the offset compensation section 42 and temperature measuring section 41 that the timing of updating the offset compensation value is when, e.g., a transmission power is changed by a TPC command.

Note that, the transmission circuit according to the fourth embodiment may have a configuration of a transmission circuit 4x as shown in FIG. 14. FIG. 14 is a block diagram showing an exemplary configuration of the transmission circuit 4x according to the fourth embodiment of the present invention. The transmission circuit 4x shown in FIG. 14 adds, in accordance with the temperature of the amplitude modulation section 15, to the amplitude signal M1, a difference between the offset compensation value stored in the memory 13 and the offset compensation value having been changed in accordance with the temperature of the amplitude modulation section 15, without updating the offset compensation value stored in the memory 13. An offset compensation section 42x includes a first adder 121, a second adder 421x, and an arithmetic processing section 422x. In the offset compensation section 42x, the arithmetic processing section 422x calculates the difference between the offset compensation value stored in the memory 13 and the offset compensation value having been changed in accordance with the temperature of the amplitude modulation section 15. The second adder 421x adds the difference of the offset compensation value, which has been calculated by the arithmetic processing section 422x, to the amplitude signal M1.

As described above, the transmission circuit 4 according to the fourth embodiment of the present invention is capable of, even if the offset compensation value and offset characteristic gradient of the amplitude modulation section 15 have changed in accordance with the temperature of the amplitude modulation section 15, precisely compensating for the offset characteristic of the amplitude modulation section 15. This allows the transmission circuit 4 to operate with low distortion.

Fifth Embodiment

Figure 15A:
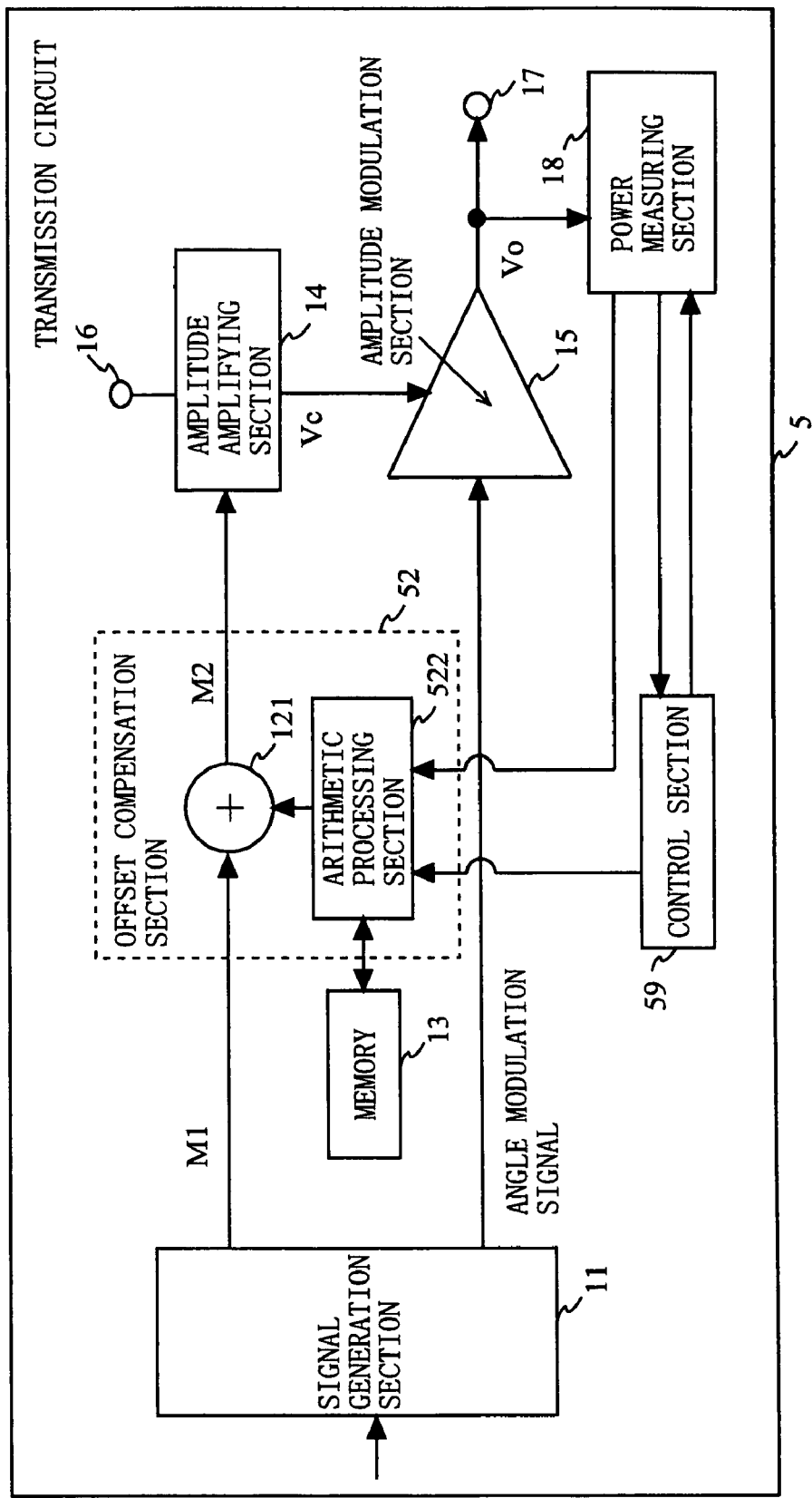
FIG. 15A is a block diagram showing an exemplary configuration of a transmission circuit 5 according to a fifth embodiment of the present invention.

FIG. 15A is a block diagram showing an exemplary configuration of a transmission circuit 5 according to a fifth embodiment of the present invention. The transmission circuit 5 shown in FIG. 15A is different from the transmission circuit 1 (see FIG. 1A) of the first embodiment in that the transmission circuit 5 is capable of, particularly when the output power of the amplitude modulation section 15 is low, updating in real time the offset compensation value stored in the memory 13 in accordance with a change in the output power of the amplitude modulation section 15, the change occurring due to, e.g., a temperature change in the amplitude modulation section 15. Note that, the transmission circuit 5 is required to update the offset compensation value stored in the memory 13 only when the output power of the amplitude modulation section 15 is low, because when the output power is high, a change occurring in output voltage due to, e.g., a temperature change in the amplitude modulation section 15 is small.

Figure 15B:
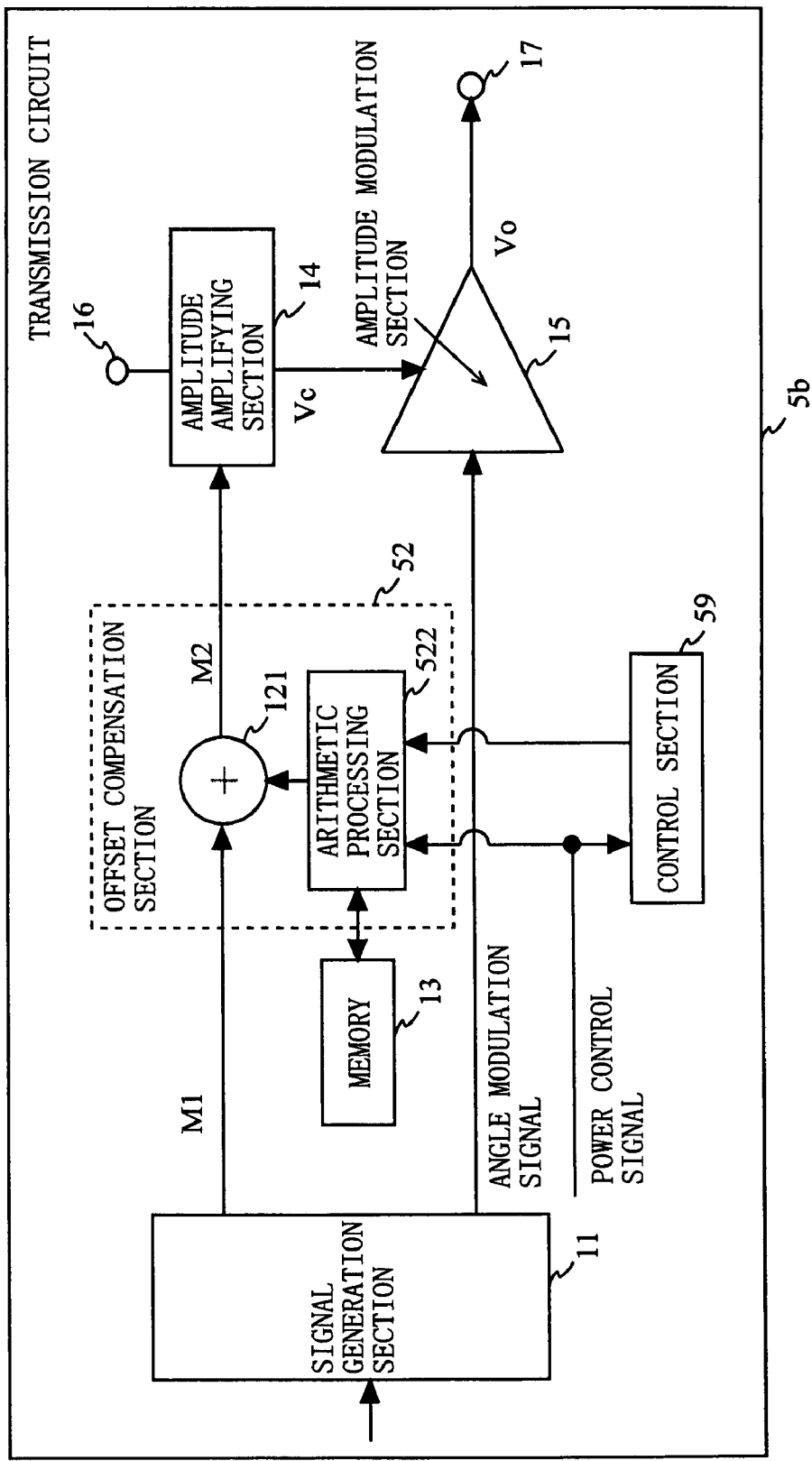
FIG. 15B is a block diagram showing an exemplary configuration of a transmission circuit 5b according to the fifth embodiment of the present invention.

A control section 59 monitors the output power of the amplitude modulation section 15 which is measured by the power measuring section 18, and when, e.g., the output power becomes a predetermined threshold value or smaller, instructs an offset compensation section 52 and the power measuring section 18 about a timing of updating the offset compensation value stored in the memory 13. The offset compensation section 52 (arithmetic processing section 522) and power measuring section 18 calculate the offset compensation value of the amplitude modulation section 15 at the timing instructed by the control section 59. The arithmetic processing section 522 updates a stored content of the memory 13 with the calculated offset compensation value. Here, the above feature of the transmission circuit according to the fifth embodiment is applicable to the transmission circuit 1b (see FIG. 1B) in a same manner as that of a transmission circuit 5b shown in FIG. 15B. In such a case, the control section 59 instructs, when, e.g., a power control signal becomes a predetermined threshold value or smaller, the offset compensation section 52 about a timing of updating the offset compensation value.

Figure 15C:
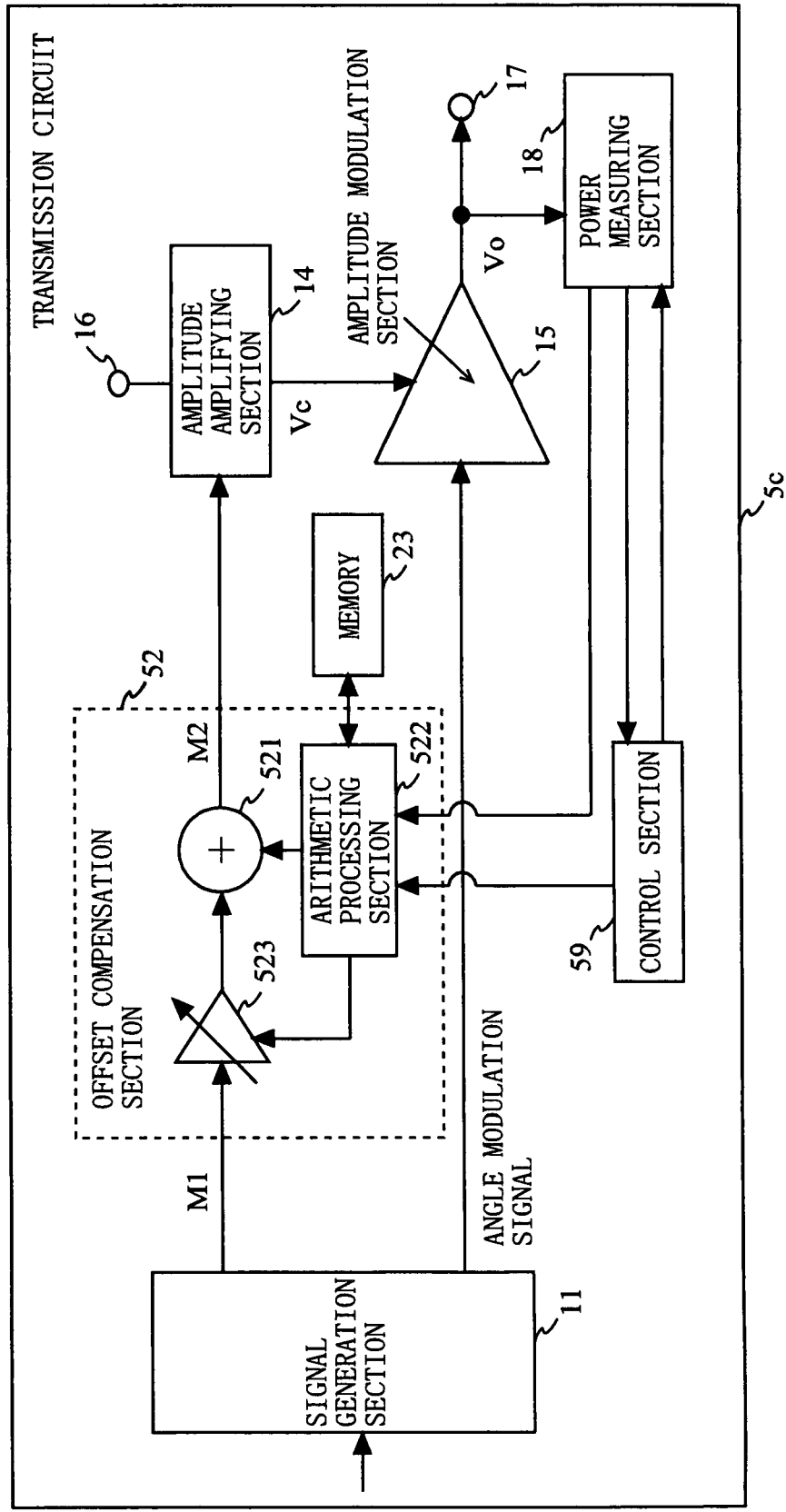
FIG. 15C is a block diagram showing an exemplary configuration of a transmission circuit 5c according to the fifth embodiment of the present invention.

Further, the above feature of the transmission circuit 5 according to the fifth embodiment is applicable to the transmission circuit 2 (see FIG. 8A) according to the second embodiment in a same manner as that of a transmission circuit 5c shown in FIG. 15C. FIG. 15C is a block diagram showing an exemplary configuration of the transmission circuit 5c according to the fifth embodiment of the present invention. The transmission circuit 5c shown in FIG. 15C is capable of, particularly when the output power of the amplitude modulation section 15 is low, updating in real time the offset compensation value and the gain, which are stored in the memory 23, in accordance with a change in the output power of the amplitude modulation section 15, the change occurring due to, e.g., a temperature change in the amplitude modulation section 15. The control section 59 monitors the output power of the amplitude modulation section 15 which is measured by the power measuring section 18, and when, e.g., the output power becomes a predetermined threshold value or smaller, instructs the offset compensation section 52 and the power measuring section 18 about a timing of updating the offset compensation value and the gain which are stored in the memory 23.

Still further, the above feature of the transmission circuit according to the fifth embodiment is applicable to the transmission circuit 2b (see FIG. 8B) according to the second embodiment in a same manner as that of a transmission circuit 5d shown in FIG. 15D. In such a case, the control section 59 instructs, when, e.g., a power control signal becomes a predetermined threshold value or smaller, the offset compensation section 52 about a timing of updating the offset compensation value and the gain. In other words, in the case where the offset characteristic gradient of the amplitude modulation section 15 has changed due to, e.g., a change in the temperature of the amplitude modulation section 15, the transmission circuits 5c and 5d according to the fifth embodiment may also update the gain of the variable gain amplifier 223 which is stored in the memory 23.

Figure 16:
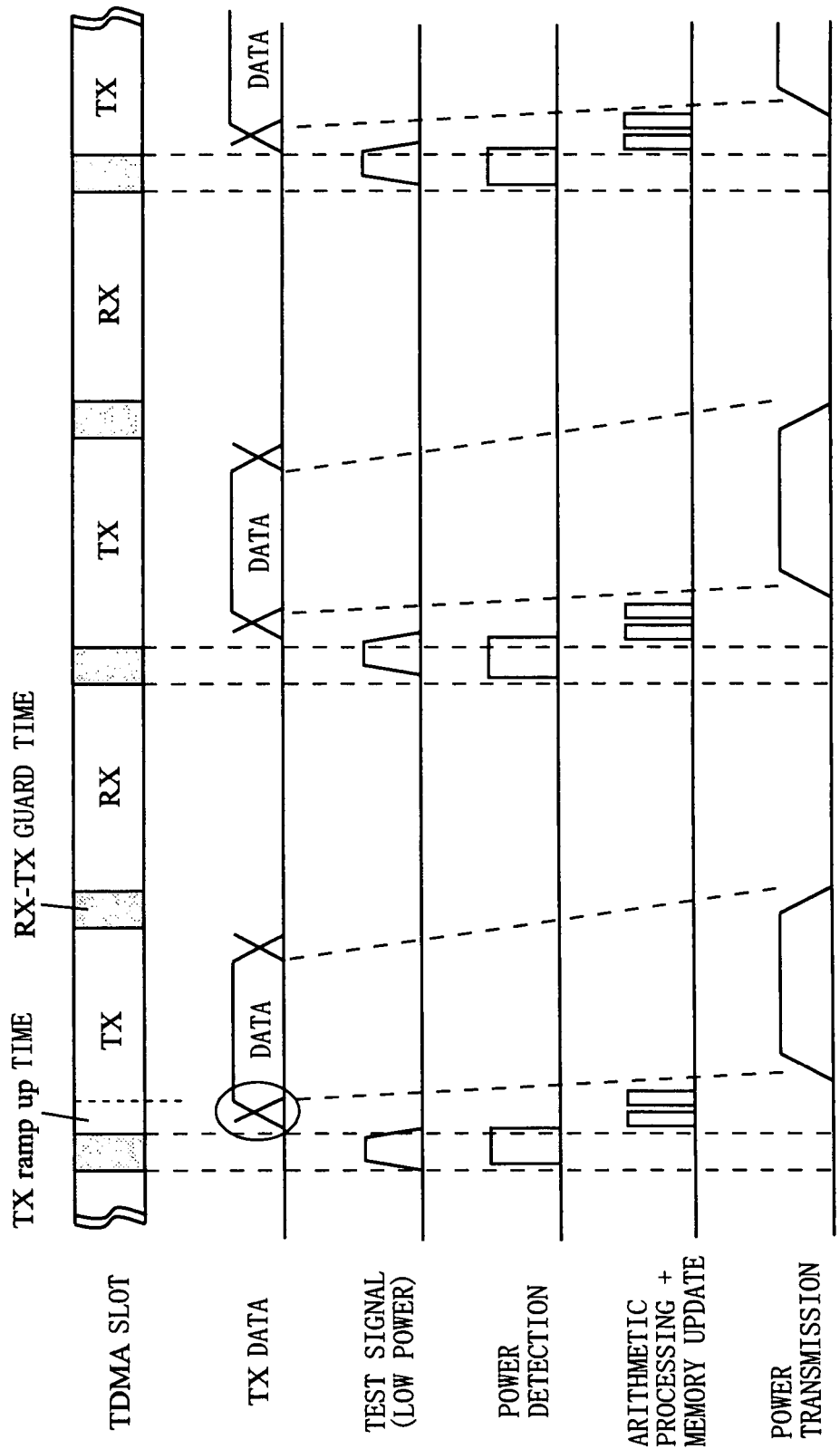
FIG. 16 illustrates a timing of updating the offset compensation value in the case where the transmission circuit 5 is applied to a TDMA system.

FIG. 16 illustrates a timing of updating the offset compensation value in the case where the transmission circuit 5 is applied to a TDMA system. As shown in FIG. 16, when the transmission circuit 5 is applied to a TDMA system, the control section 59 transmits, e.g., a low-power test signal within a TX ramp up time, and controls the offset compensation section 52 and power measuring section 18 such that the offset compensation section 52 and power measuring section 18 calculate the offset compensation value of the amplitude modulation section 15 in accordance with the transmitted test signal.

As described above, the transmission circuit 5 according to the fifth embodiment of the present invention is capable of precisely compensating for the offset characteristic of the amplitude modulation section 15 in accordance with the output power of the amplitude modulation section 15 even in the case where the offset compensation value and offset characteristic gradient of the amplitude modulation section 15 have changed. This allows the transmission circuit 5 to operate with further reduced distortion.

Note that, the transmission circuits according to the above fourth to sixth embodiments are not necessarily required to calculate the offset compensation value and offset characteristic gradient at the timings shown in FIGS. 12, 13 and 16. These timings are merely examples. The same effects as described above are obtained as long as a transmission circuit updates, in real time, the offset compensation value and offset characteristic gradient which are stored in the memory 13, in accordance with a change which occurs in the output power of the amplitude modulation section 15 due to a temperature change or the like.

Sixth Embodiment

Figure 17:
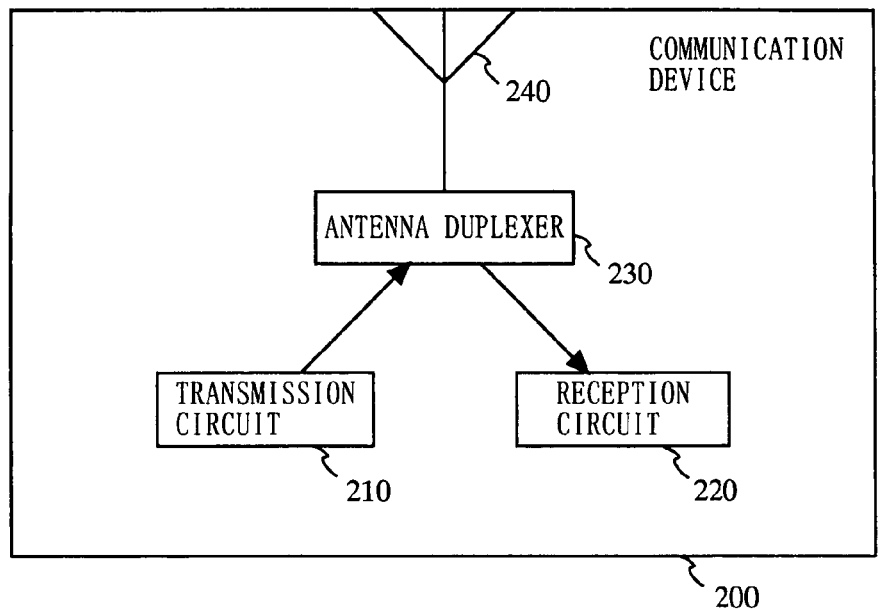
FIG. 17 is a block diagram showing an exemplary configuration of a communication device according to a sixth embodiment of the present invention.
Figure 18:
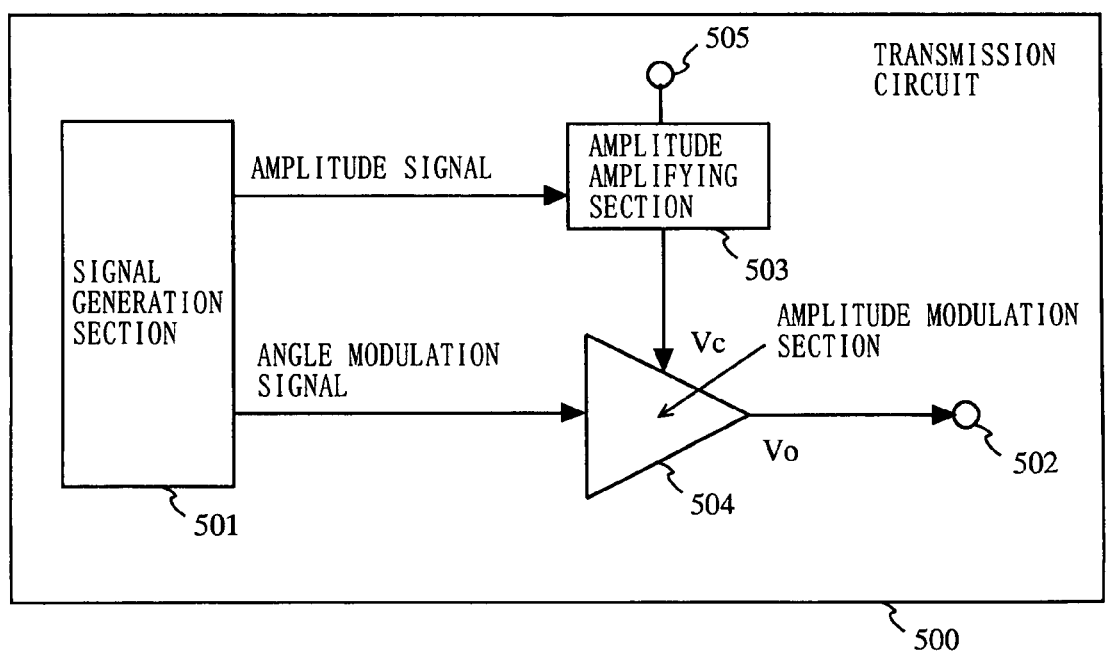
FIG. 18 is a block diagram showing an exemplary configuration of a conventional transmission circuit 500.
Figure 19:
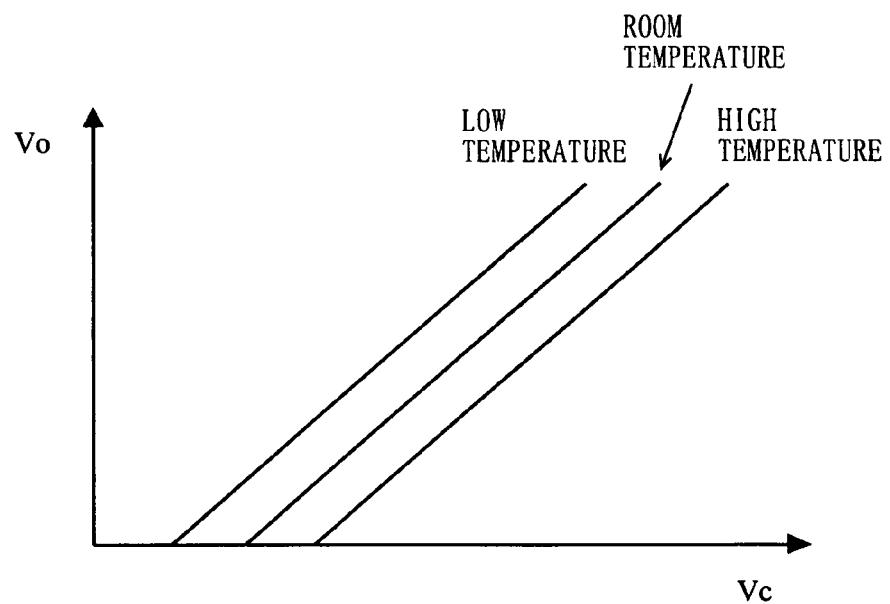
FIG. 19 shows a relationship between a collector voltage Vc, which is supplied to an amplitude modulation section 504, and an output voltage Vo.
Figure 20:
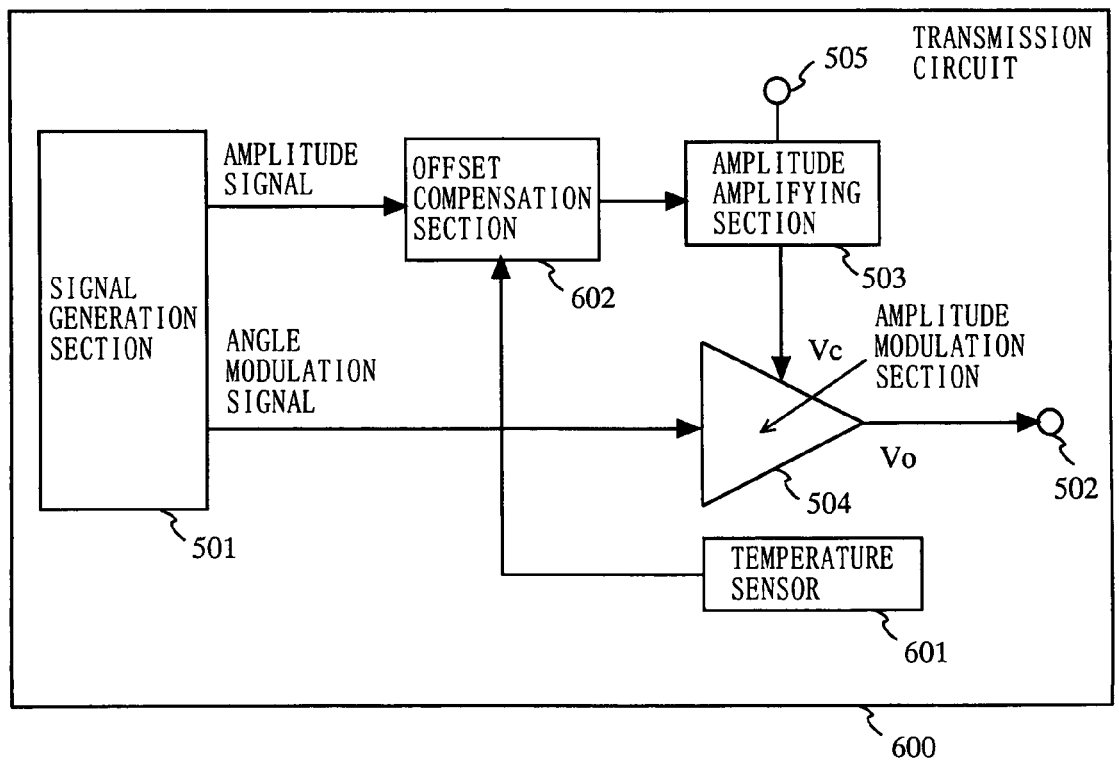
FIG. 20 is a block diagram showing an exemplary configuration of a conventional transmission circuit 600.

FIG. 17 is a block diagram showing an exemplary configuration of a communication device according to a sixth embodiment of the present invention. As shown in FIG. 17, a communication device 200 according to the sixth embodiment comprises a transmission circuit 210, reception circuit 220, antenna duplexer 230 and an antenna 240. The transmission circuit 210 is any one of the transmission circuits described in the above first to fifth embodiments. The antenna duplexer 230 transmits to the antenna 240 a transmission signal outputted from the transmission circuit 210, and prevents the transmission signal from leaking to the reception circuit 220. Also, the antenna duplexer 230 transmits to the reception circuit 220 a reception signal inputted from the antenna 240, and prevents the reception signal from leaking to the transmission circuit 210.

Accordingly, the transmission signal is outputted from the transmission circuit 210, and released from the antenna 240 to the exterior space via the antenna duplexer 230. The reception signal is received by the antenna 240, and then received by the reception circuit 220 via the antenna duplexer 230. The communication device 200 according to the sixth embodiment uses any of the transmission circuits according to the first to fifth embodiments, thereby securing the linearity of the transmission signal and also realizing low distortion of a radio device. Since there is no branching element, such as a directional coupler, on an output of the transmission circuit 210, loss from the transmission circuit 210 to the antenna 240 is reduced, whereby power consumption at the time of transmission is reduced. As a result, the communication device 200 is capable of operating for a long period of time as a radio communication device. Note that, the communication device 200 may have a configuration which includes only the transmission circuit 210 and antenna 240.

The transmission circuits according to the present invention are applicable to communication devices such as mobile phones and wireless LAN devices.

While the invention has been described in detail, the foregoing description is in all aspects illustrative and not restrictive. It is understood that numerous other modifications and variations can be devised without departing from the scope of the invention.

What is claimed is:

1. A transmission circuit for generating and outputting a transmission signal based on input data, the transmission circuit comprising:
    a signal generating section for performing predetermined signal processing on the input data, thereby generating an amplitude signal and an angle modulation signal;
    an offset compensation section for compensating for a magnitude of the amplitude signal in accordance with a predetermined instruction;
    an amplitude amplifying section for outputting a signal corresponding to the magnitude of the amplitude signal inputted via the offset compensation section;
    an amplitude modulation section for amplitude-modulating the angle modulation signal by using the signal outputted from the amplitude amplifying section, and outputting a resultant signal as a modulation signal having been angle-modulated and amplitude-modulated;
    a power measuring section for measuring an output power of the amplitude modulation section;
    a memory section for storing an offset compensation value for compensating for an offset characteristic of the amplitude modulation section and a gain for compensating for an offset characteristic gradient of the amplitude modulation section; and
    a control section for controlling, at a predetermined timing, operations of the offset compensation section and the power measuring section, wherein
    the offset compensation section includes an arithmetic processing section for outputting a plurality of amplitude signals whose magnitudes are varied from each other and calculating the gain in accordance with a plurality of changes in the output power of the amplitude modulation section, the power measuring section measuring the output power when the plurality of amplitude signals are outputted,
    in accordance with an instruction from the control section, the offset compensation section reads, from the memory section, the offset compensation value and the gain corresponding to the output power of the amplitude modulation section, the output power having been measured by the power measuring section, amplifies the amplitude signal based on the gain, and adds the read offset compensation value to the amplitude signal.

2. The transmission circuit according to claim 1, wherein the
    arithmetic processing section reads, from the memory section, the offset compensation value corresponding to the output power of the amplitude modulation section, and
    the offset compensation section further includes an adder section for adding, to the amplitude signal, the offset compensation value read by the arithmetic processing section.

3. The transmission circuit according to claim 1, wherein the
    arithmetic processing section reads, from the memory section, the offset compensation value and the gain which correspond to the output power of the amplitude modulation section, and
    the offset compensation section further includes:
        a variable gain amplifier section for amplifying the amplitude signal by the gain read by the arithmetic processing section; and
        an adder section for adding the offset compensation value read by the arithmetic processing section to the amplitude signal outputted from the variable gain amplifier section.

4. The transmission circuit according to claim 2, wherein
    the control section instructs the arithmetic processing section and the power measuring section to calculate the offset compensation value for compensating for the offset characteristic of the amplitude modulation section,
    when instructed to calculate the offset compensation value, the power measuring section measures the output power of the amplitude modulation section, and
    when instructed to calculate the offset compensation value, the arithmetic processing section outputs a plurality of amplitude signals whose magnitudes are varied from each other, and calculates the offset compensation value in accordance with a change in the output power of the amplitude modulation section, the power measuring section measuring the output power when the plurality of amplitude signals are outputted.

5. The transmission circuit according to claim 4, further comprising a temperature measuring section for measuring a temperature of the amplitude modulation section, wherein
    the control section provides the arithmetic processing section and the temperature measuring section with an instruction to update a stored content of the memory section,
    in accordance with the instruction from the control section, the temperature measuring section measures the temperature of the amplitude modulation section, and
    in accordance with the instruction from the control section, the arithmetic processing section calculates the offset compensation value corresponding to the temperature of the amplitude modulation section which has been measured by the temperature measuring section, and updates the stored content of the memory section by using the calculated offset compensation value.

6. The transmission circuit according to claim 1, further comprising a temperature measuring section for measuring a temperature of the amplitude modulation section, wherein
    the control section provides the arithmetic processing section and the temperature measuring section with an instruction to update a stored content of the memory section,
    in accordance with the instruction from the control section, the temperature measuring section measures the temperature of the amplitude modulation section, and
    in accordance with the instruction from the control section, the arithmetic processing section calculates the gain for compensating for the offset characteristic gradient corresponding to the temperature of the amplitude modulation section, the temperature having been measured by the temperature measuring section, and updates the stored content of the memory section by using the calculated gain.

7. A transmission circuit for generating and outputting a transmission signal based on input data, the transmission circuit comprising:
- a signal generating section for performing predetermined signal processing on the input data, thereby generating an amplitude signal and an angle modulation signal;
- an offset compensation section for compensating for a magnitude of the amplitude signal;
- an amplitude amplifying section for outputting a signal corresponding to the magnitude of the amplitude signal inputted via the offset compensation section;
- an amplitude modulation section for amplitude-modulating the angle modulation signal by using the signal outputted from the amplitude amplifying section, and outputting a resultant signal as a modulation signal having been angle-modulated and amplitude-modulated;
- a memory section for storing an offset compensation value for compensating for an offset characteristic of the amplitude modulation section and a gain for compensating for an offset characteristic gradient of the amplitude modulation section; and
- a control section for controlling an operation of the offset compensation section at a predetermined timing, wherein
- the offset compensation section receives a power control signal for controlling an output power of the transmission signal,
- the offset compensation section includes an arithmetic processing section for outputting a plurality of amplitude signals whose magnitudes are varied from each other and calculating the gain in accordance with a plurality of changes in the output power of the amplitude modulation section, the power measuring section measuring the output power when the plurality of amplitude signals are outputted, and
- in accordance with an instruction from the control section, the offset compensation section reads, from the memory section, the offset compensation value and the gain corresponding to the power control signal, amplifies the amplitude signal based on the gain, and adds the read offset compensation value to the amplitude signal.

8. A communication device comprising:
a transmission circuit for generating a transmission signal; and
an antenna for outputting the transmission signal generated by the transmission circuit, wherein
the transmission circuit is the transmission circuit according to claim 1.

9. The communication device according to claim 8, further comprising:
- a reception circuit for processing a reception signal received from the antenna; and
- an antenna duplexer for outputting the transmission signal generated by the transmission circuit to the antenna, and outputting the reception signal received from the antenna to the reception circuit.

* * * * *